(12) United States Patent
Galton et al.

(10) Patent No.: US 12,726,212 B2
(45) Date of Patent: Sep. 1, 2026

(54) DTC LINEARIZATION VIA MISMATCH-NOISE CANCELLATION FOR DIGITAL FRACTIONAL-N PLLS

(71) Applicant: THE REGENTS OF THE UNIVERSITY OF CALIFORNIA, Oakland, CA (US)

(72) Inventors: Ian Andrew Galton, Del Mar, CA (US); Amr Eissa, La Jolla, CA (US); Eslam Helal, La Jolla, CA (US)

(73) Assignee: The Regents of the University of California, Oakland, CA (US)

( * ) Notice: Subject to any disclaimer, the term of this patent is extended or adjusted under 35 U.S.C. 154(b) by 125 days.

(21) Appl. No.: 18/911,901

(22) Filed: Oct. 10, 2024

(65) Prior Publication Data

US 2025/0167797 A1 May 22, 2025

Related U.S. Application Data

(60) Provisional application No. 63/589,374, filed on Oct. 11, 2023.

(51) Int. Cl.

| | |
|---|---|
| ***H03M 3/00*** | (2006.01) |
| ***H03L 7/099*** | (2006.01) |
| *H03L 7/197* | (2006.01) |
| *H03M 1/34* | (2006.01) |

(52) U.S. Cl.

CPC .......... *H03M 3/368* (2013.01); *H03L 7/0991* (2013.01); *H03L 7/1976* (2013.01); *H03M 1/34* (2013.01); *H03M 3/496* (2013.01)

(58) Field of Classification Search

CPC ........ H03M 3/368; H03M 3/496; H03M 1/34; H03L 7/0991; H03L 7/1976

See application file for complete search history.

(56) References Cited

U.S. PATENT DOCUMENTS 10,895,850 B1 * 1/2021 Elkholy ................ G04F 10/005

OTHER PUBLICATIONS

Swaminathan et al., "A Digital Requantizer With Shaped Requantization Noise That Remains Well Behaved After Nonlinear Distortion," IEEE Transactions on Signal Processing, 2007, pp. 5382-5394, vol. 55, No. 11, IEEE.

Familier et al., "A Fundamental Limitation of DC-Free Quantization Noise With Respect To Nonlinearity-Induced Spurious Tones," IEEE Transactions on Signal Processing, 2013, pp. 4172-4180, vol. 61, No. 16, IEEE.

Zanuso et al., "A 3MHz-BW 3.6GHz Digital Fractional-N PLL with Sub-Gate-Delay TDC, Phase-Interpolation Divider, and Digital Mismatch Cancellation," 2010 IEEE International Solid-State Circuits Conference, 2010, pp. 476-478, IEEE.

(Continued)

*Primary Examiner* — Joseph J Lauture

(74) *Attorney, Agent, or Firm* — Greer, Burns & Crain, Ltd.; Steven P. Fallon

(57) ABSTRACT

A fractional-N PLL includes a reference oscillator, a multi-modulus divider-based phase-error-to-digital converter driven by the reference oscillator, a digital loop filter, and a digitally controlled oscillator. Digital-to-time to converter mismatch noise cancellation digital logic is between the phase-error-to-digital converter and the digital loop filter. Error from digital-to-time converter component mismatches is partially cancelled by the digital logic.

9 Claims, 12 Drawing Sheets

(56) References Cited

OTHER PUBLICATIONS

Tasca et al., "A 2.9-4.0-GHz Fractional-N Digital PLL With Bang-Bang Phase Detector and 560-fsrms Integrated Jitter at 4.5-mW Power," IEEE Journal of Solid-State Circuits, 2011, pp. 2745-2758, vol. 46, No. 12, IEEE.
Pavlovic et al., "A 5.3GHZ Digital-to-Time-Converter-Based Fractional-N All-Digital PLL," 2011 IEEE International Solid-State Circuits Conference, 2011, pp. 54-56, IEEE.
Wu et al., "A 14-nm Ultra-Low Jitter Fractional-N PLL Using a DTC Range Reduction Technique and a Reconfigurable Dual-Core VCO," IEEE Journal of Solid-State Circuits, 2021, pp. 3756-3767, vol. 56, No. 12, IEEE.
Wu et al., "A 28-nm 75-fsrms Analog Fractional-N Sampling PLL With a Highly Linear DTC Incorporating Background DTC Gain Calibration and Reference Clock Duty Cycle Correction," IEEE Journal of Solid-State Circuits, 2019, pp. 1254-1265, vol. 54, No. 5, IEEE.
Santiccioli et al., "A 66-fs-rms Jitter 12.8-to-15.2-GHz Fractional-N Bang-Bang PLL With Digital Frequency-Error Recovery for Fast Locking," IEEE Journal of Solid-State Circuits, pp. 3349-3361, vol. 55, No. 12, IEEE.
Levantino et al., "A 1.7 GHZ Fractional-N Frequency Synthesizer Based on a Multiplying Delay-Locked Loop," IEEE Journal of Solid-State Circuits, 2015, pp. 2678-2691, vol. 50, No. 11, IEEE.
Narayanan et al., "A Fractional-N Sub-Sampling PLL using a Pipelined Phase-Interpolator With an FoM of −250 dB," IEEE Journal of Solid-State Circuits, 2016, pp. 1630-1640, vol. 51, No. 7, IEEE.
Levantino et al., "An Adaptive Pre-Distortion Technique to Mitigate the DTC Nonlinearity in Digital PLLs," IEEE Journal of Solid-State Circuits, 2014, pp. 1762-1772, vol. 49, No. 8, IEEE.
Markulic et al., "A DTC-Based Subsampling PLL Capable of Self-Calibrated Fractional Synthesis and Two-Point Modulation," IEEE Journal of Solid-State Circuits, 2016, pp. 3078-3092, vol. 51, No. 12, IEEE.
Liu et al., "A Fully Synthesizable Fractional-N MDLL With Zero-Order Interpolation-Based DTC Nonlinearity Calibration and Two-Step Hybrid Phase Offset Calibration," IEEE Transactions on Circuits and Systems—I: Regular Papers, 2021, pp. 603-616, vol. 68, No. 2, IEEE.
Staszewski et al., "All-Digital PLL and Transmitter for Mobile Phones," IEEE Journal of Solid-State Circuits, 2005, pp. 2469-2482, vol. 40, No. 12, IEEE.
Tonietto et al., "A 3MHz Bandwidth Low Noise RF All Digital PLL with 12ps Resolution Time to Digital Converter," 2006 Proceedings of the 32nd European Solid-State Circuits Conference, 2006, pp. 150-153, IEEE.
Weltin-Wu et al., "A 3GHZ Fractional-N All-Digital PLL with Precise Time-to-Digital Converter Calibration and Mismatch Correction," 2008 IEEE International Solid-State Circuits Conference, 2008, pp. 344-345, IEEE.
Hsu et al., "A Low-Noise Wide-BW 3.6-GHz Digital ΔΣ Fractional-N Frequency Synthesizer With a Noise-Shaping Time-to-Digital Converter and Quantization Noise Cancellation," IEEE Journal of Solid-State Circuits, 2008, pp. 2776-2786, vol. 43, No. 12, IEEE.
Kratyuk et al., "A Digital PLL With a Stochastic Time-to-Digital Converter," IEEE Transactions of Circuits and Systems—I: Regular Papers, 2009, pp. 1612-1621, vol. 56, No. 8, IEEE.
Temporiti et al., "A 3.5 GHZ Wideband ADPLL With Fractional Spur Suppression Through TDC Dithering and Feedforward Compensation," IEEE Journal of Solid-State Circuits, 2010, pp. 2723-2736, vol. 45, No. 12, IEEE.
Venerus et al., "Delta-Sigma FDC Based Fractional-N PLLs," IEEE Transactions on Circuits and Systems—I: Regular Papers, 2013, pp. 1274-1285, vol. 60, No. 5, IEEE.
Marcucci et al., "Analysis and Design of Low-Jitter Digital Bang-Bang Phase-Locked Loops," IEEE Transactions on Circuits and Systems—I: Regular Papers, 2014, pp. 26-36, vol. 61, No. 1, IEEE.
Elkholy et al., "A 3.7 mW Low-Noise Wide-Bandwidth 4.5 GHz Digital Fractional-N PLL Using Time Amplifier-Based TDC," IEEE Journal of Solid-State Circuits, 2015, pp. 867-881, vol. 50, No. 4, IEEE.
Weltin-Wu et al., "A Linearized Model for the Design of Fractional-N Digital PLLs Based on Dual-Mode Ring Oscillator FDCs," IEEE Transactions on Circuits and Systems—I: Regular Papers, 2015, pp. 2013-2023, vol. 62, No. 8, IEEE.
Kuo et al., "An All-Digital PLL for Cellular Mobile Phones in 28-nm CMOS with −55 dBc Fractional and −91 dBc Reference Spurs," IEEE Transactions on Circuits and Systems—I: Regular Papers, 2018, pp. 3756-3768, vol. 65, No. 11, IEEE.
Alvarez-Fontecilla et al., "Delta-Sigma FDC Enhancements for FDC-Based Digital Fractional-N PLLs," IEEE Transactions on Circuits and Systems—I: Regular Papers, 2021, pp. 965-974, vol. 68, No. 3, IEEE.
Alvarez-Fontecilla et al., "Spectral Breathing and Its Mitigation in Digital Fractional-N PLLs," IEEE Journal of Solid-State Circuits, 2021, pp. 3191-3201, vol. 56, No. 10, IEEE.
Markulic et al., "A 10-bit, 550-fs step Digital-to-Time Converter in 28nm CMOS," ESSCIRC 2014—40th European Solid State Circuits Conference (ESSCIRC), 2014, pp. 79-82, IEEE.
Chang et al., "A Fractional-N Divider-Less Phase-Locked Loop With a Subsampling Phase Detector," IEEE Journal of Solid-State Circuits, 2014, pp. 2964-2975, vol. 49, No. 12, IEEE.
Lin et al., "A 12bit 100fs Resolution Multi-Stage Digital-to-Time Converter with Dynamic Element Matching," 2021 IEEE International Conference on Integrated Circuits, Technologies and Applications, 2021, pp. 31-32, IEEE.
Galton, "Why Dynamic-Element-Matching DACs Work", IEEE Transactions on Circuits and Systems—II: Express Briefs, 2010, pp. 69-74, vol. 57, No. 2, IEEE.
Chan et al., "Segmented Dynamic Element Matching for High-Resolution Digital-to-Analog Conversion," IEEE Transactions on Circuits and Systems—I: Regular Papers, 2008, pp. 3383-3392, vol. 55, No. 11, IEEE.
Chan et al., "Dynamic Element Matching to Prevent Nonlinear Distortion From Pulse-Shape Mismatches in High-Resolution DACs," IEEE Journal of Solid-State Circuits, 2008, pp. 2067-2078, vol. 43, No. 9, IEEE.
Kong et al., "MSE Analysis of a Multi-Loop LMS Pseudo-Random Noise Canceler for Mixed-Signal Circuit Calibration," IEEE Transactions on Circuits and Systems—I: Regular Papers, 2020, pp. 3084-3098, vol. 67, No. 9, IEEE.
Helal et al., "A Time Amplifier Assisted Frequency-to-Digital Converter Based Digital Fractional-N PLL," IEEE Journal of Solid-State Circuits, 2021, pp. 2711-2723, vol. 56, No. 9, IEEE.
Pamarti et al., "Statistics of the Quantization Noise in 1-Bit Dithered Single-Quantizer Digital Delta-Sigma Modulators," IEEE Transactions on Circuits and Systems—I: Regular Papers, 2007, pp. 492-503, vol. 54, No. 3, IEEE.
Cassia et al., "Analytical Model and Behavioral Simulation Approach for a ΣΔ Fractional-N Synthesizer Employing a Sample-Hold Element," IEEE Transactions on Circuits and Systems—II: Analog and Digital Signal Processing, 2003, pp. 850-859, vol. 50, No. 11, IEEE.
Syllaios et al., "Time-Domain Modeling of an RF All-Digital PLL," IEEE Transactions on Circuits and Systems—II: Express Briefs, 2008, pp. 601-605, vol. 55, No. 6, IEE.

* cited by examiner

DEM: off, MNC: off
$P_{spur} = -40$ dBc
$\sigma_{TJ} = 550$ $fs_{rms}$
Ideal
$\sigma_{TJ} = 90$ $fs_{rms}$ White $s_k[n]$ Sequences
DEM: on, MNC: off
$\sigma_{TJ} = 335$ $fs_{rms}$
Ideal
$\sigma_{TJ} = 90$ $fs_{rms}$
DEM: on, MNC: on
$\sigma_{TJ} = 90$ $fs_{rms}$ Shaped $s_k[n]$ Sequences
DEM: on, MNC: off
$\sigma_{TJ} = 120$ $fs_{rms}$
Ideal
$\sigma_{TJ} = 90$ $fs_{rms}$
DEM: on, MNC: on
$\sigma_{TJ} = 90$ $fs_{rms}$ PLL phase noise [dBc/Hz]
Offset frequency[Hz]

White $s_k[n]$ Sequences
$\times 10^{-3}$
2
1
0
-1
-2
-3
$z_k[n]$

White $s_k[n]$ Sequences
$\times 10^{-3}$
2
1
0
-1
-2
-3
$z_k[n]$
0
1
2
3
4
5
$n$
$\times 10^{4}$

DTC LINEARIZATION VIA MISMATCH-NOISE CANCELLATION FOR DIGITAL FRACTIONAL-N PLLS

PRIORITY CLAIM AND REFERENCE TO RELATED APPLICATION

The application claims priority under 35 U.S.C. § 119 and all applicable statutes and treaties from prior U.S. provisional application Ser. No. 63/589,374, which was filed Oct. 11, 2023, and is incorporated by reference herein.

STATEMENT OF GOVERNMENT INTEREST

This invention was made with government support under grant no. 1909678 awarded by the National Science Foundation. The government has certain rights in the invention.

TECHNICAL FIELD

A field of the invention is frequency synthesis. Example applications of the invention are in wired and wireless communications. A particular application of the invention is in wireless transceivers for the generation of radio frequency (RF) local oscillator signals used to up-convert and down-convert transmitted and received RF signals.

BACKGROUND

Transceivers in modern communication systems, such as 5G mobile communication systems, typically require finely-tunable frequency synthesizer blocks with well under 100 femtoseconds of jitter. Such frequency synthesizers are typically implemented as fractional-N phase-locked loops (PLLs). PLLs with digital-to-time converter (DTC) based quantization noise cancellation (QNC) have recently been shown to enable excellent fractional-N PLL performance, but they require highly-linear DTCs, which are challenging to implement. Known DTC linearization strategies include analog-domain techniques which involve performance tradeoffs and digital predistortion techniques which converge slowly relative to typical required PLL settling times A DTC implemented as a cascade of 1-bit DTC stages can be made highly linear without special techniques. Yet, such DTCs typically introduce excessive error from component mismatches, which has so far hindered their use in low jitter PLLs.

Signal processing performed within any fractional-N phase-locked loop (PLL) for frequency synthesis inevitably involves quantization. The resulting quantization error degrades the PLL's phase noise unless it is actively canceled prior to frequency modulation, a process known as quantization noise cancellation (QNC). An increasingly popular QNC method uses a digital-to-time converter (DTC) to cancel most of the quantization error prior to phase error measurement within the PLL. This prevents the quantization noise from being subjected to the inadvertent but inevitable nonlinearity of the phase error measurement circuitry, thereby avoiding fractional spurs which would otherwise be caused by nonlinearly distorting the quantization error [Ref 1]-[Ref 5].

However, for such DTC-based QNC to be effective, the DTC must be highly linear. Otherwise, it nonlinearly distorts the quantization error directly, so it becomes a cause of fractional spurs in its own right. Several analog and digital techniques have been proposed to linearize DTC circuits to address this issue. The published analog techniques generally increase power consumption or circuit area considerably [Ref 6]-[Ref 10]. The published digital techniques perform predistortion via look-up tables (LUTs) to mitigate DTC nonlinearity, but the data with which the LUTs are populated must be measured in background via correlation algorithms which take considerably longer to converge than typical target PLL settling times [Ref 11]-[Ref 13]. As examples, the cold-start convergence times of the techniques presented in [Ref 11] and [Ref 12] are over 30,000 and 600,000 reference cycles, respectively.

Alternatively, a DTC implemented as a cascade of 1-bit DTC stages can be made highly linear without any special linearization techniques provided the stages are sufficiently buffered so that the state of each stage does not significantly affect the delays through the other stages. However, such DTCs typically introduce far more error from component mismatches than the more commonly used single-stage DTCs, which has so far stymied their application to DTC-based QNC in low-jitter PLLs. While dynamic element matching (DEM) can be applied to cause the DTC error arising from component mismatches, i.e., the DTC mismatch noise, to be free of nonlinear distortion and have a highpass spectral shape, the power of the mismatch noise nevertheless tends to be high enough that it significantly degrades the PLL's jitter.

DTC-Based Quantization Noise Cancellation.

FIG. 1A shows the general form of a digital fractional-N PLL driven by an $f_{ref}$-frequency reference oscillator. FIG. 1B shows the general form of a multi-modulus divider-based PEDC. [Ref 14]-[Ref 26]. The PLL is comprised of a phase-error-to-digital converter (PEDC), a lowpass digital loop filter, and a digitally controlled oscillator (DCO). Its objective is to generate a low-noise oscillatory output signal, $v_{PLL}(t)$, with instantaneous frequency $f_{PLL}=(N+\alpha)f_{ref}$, where N is a positive integer and a is a fractional value bounded in magnitude by 1.

In many digital fractional-N PLLs, the PEDC incorporates a multi-modulus divider as shown in FIG. 1B. The multi-modulus divider is controlled such that its nth and (n+1)th rising output edges are separated by N−v[n] DCO cycles, where v[n] is an integer-valued digital sequence generated within the PEDC. The rest of the PEDC digitizes the phase difference between $v_{ref}(t)$ and $v_{div}(t)$ to generate p[n], and the PLL's feedback loop controls the DCO such that p[n] stays bounded, thereby ensuring that the divider's average output frequency is $f_{ref}$. In some PLLs, v[n] is generated by a digital delta-sigma (ΔΣ) modulator such that its average value is −α, and in other PLLs, v[n] is generated within the PLL's feedback loop such that its average converges to −α. In either case, the N−v[n] division in conjunction with the feedback causing the divider's average output frequency to converge to $f_{ref}$ causes the DCO's average output frequency to converge to $(N+\alpha)f_{ref}$.

The reason that v[n] is restricted to integer values is that dividers are only capable of counting integer numbers of DCO cycles. Hence, in all such PLLs, v[n] contains zero-mean quantization error which ultimately contributes to the PLL's overall phase error unless it is canceled prior to the DCO via QNC.

The quantization process with which the PEDC generates v[n] happens in the digital domain so the quantization error is known to the system. One option is to perform QNC in the digital domain after the PEDC digitizes the phase difference between $v_{ref}(t)$ and $v_{div}(t)$. However, in most PLLs with divider-based PEDCs, quantization error is the dominant component in v[n] and when the quantization error is subjected to the inevitable nonlinearity of the PEDC's phase error measurement and digitization circuitry, fractional spurs are induced which digital-domain QNC is unable to cancel. Therefore, it is desirable to perform QNC prior to phase error measurement and digitization, if possible.

In principle, this can be done by inserting a DTC between the divider output and the rest of the PEDC. Ideally, the DTC would introduce a time delay of $T_D+\varepsilon[n]$ to the nth output edge of the divider, where ε[n] represents the effect of the quantization error on the time of the nth rising output edge of the divider, and $T_D$ is a constant that is large enough to ensure that $T_D+\varepsilon[n]>0$ for DTC causality. Hence, the time of the nth rising edge of the DTC output is the ideal time of the nth rising edge of the divider output, i.e., the time that would have resulted had v[n] not been quantized, aside from an additional fixed delay of $T_D$. The rest of the PEDC digitizes the phase difference between $v_{ref}$ (t) and $v_{DTC}$ (t), so the PLL's feedback controls the DCO such that the average value of this difference converges to zero, thereby causing the average DCO frequency to converge to (N+α) $f_{ref}$. The primary difference between this case and that of FIG. 1 is that QNC occurs prior to phase error measurement and digitization, which has the potential to significantly reduce spurious tones.

A commonly used DTC circuit is shown in FIG. 2 [Ref 7], [Ref 8], [Ref 27]. It consists of inverters $I_1$, $I_2$, $I_3$, and $I_4$, and a bank of capacitors. The capacitor's top plate is connected to the output of inverter $I_2$, and its bottom plate is connected to or disconnected from ground when the ith bit of the input codeword c[n] is high or low, respectively. Hence, c[n] controls the RC time constant at the output of inverter $I_2$, and, consequently, the delay through the DTC.

Inverter $I_2$ differs from the other inverters, which are standard two-transistor inverters, in that it contains resistor R in series with the drain of the inverter's pMOS transistor. The pMOS transistor is chosen to be wide enough that its on-resistance is small compared to R. This makes the time constant at the output node of inverter $I_2$ relatively independent of the transistor's on-resistance when the inverter's output voltage transitions from low-to-high, thereby improving the DTC's linearity, i.e., the linearity of the delay between each rising edge of $v_{div}$ (t) and the corresponding rising edge of $v_{DTC}$ (t) as a function of c[n]. Another advantage of this design choice is that the large pMOS transistor size results in a relatively low flicker noise contribution from the transistor. As the PLL's timing information is only carried by the times of the rising edges of the divider and DTC outputs, it is not necessary for the nMOS transistor in inverter $I_2$ to be large or to include a resistor in series with its drain.

Nonideal DTC Behavior

A DTC's resolution specifies the number of different delays that the DTC is able to introduce. For example, if the capacitors in the DTC of FIG. 2 have values of $2^iC$ for i=0, 1, 2, . . . , b−1, and the i th bit of c[n] controls the transistor connected to the $2^iC$ capacitor, then the DTC is said to have b bits of resolution because it can introduce $2^b$ different delays.

In many applications, the minimum step-size of a is so small that it is not practical to implement a DTC with sufficient resolution to achieve delays of exactly $T_D+\varepsilon[n]$, so it is often necessary to have the DTC input be a quantized version of ε[n]. As described above, the purpose of the DTC is to cancel the effect of the quantization error in v[n] prior to the PEDC's phase error measurement and digitization process, so quantizing ε[n] prior to the DTC appears, at first glance, to defeat the purpose of the DTC. However, the error from quantizing ε[n] prior to the DTC usually can be made much smaller than the quantization error in v[n], so the quantization-noise-induced spurious tones it causes are much smaller than the those which would have occurred in the absence of the DTC. Furthermore, the quantization of ε[n] is done in the digital domain, so the quantization error is available within the PEDC as digital sequence. Hence, if necessary, the small amount of quantization error introduced by the quantization of ε[n] can be canceled within the rest of the PEDC following the phase error measurement and digitization operation.

Another practical DTC limitation relates to component mismatches. In the DTC example described above, the $2^iC$ capacitor would typically be implemented as a parallel combination of $2^i$ unit capacitors of size C for each i=1, . . . , b−1. Mismatches among the different unit capacitors from fabrication errors and systematic layout asymmetries cause the b capacitors to deviate from their ideal values, which results in DTC nonlinearity.

If necessary, DEM can be applied to at least partially address this problem [Ref 28], [Ref 29]. Provided the number of DTC capacitors and their nominal values satisfy certain constraints, a digital DEM encoder can be used prior to the DTC to control which capacitors are connected and disconnected within the DTC during each reference period such that the error introduced by component mismatches is either white or highpass spectrally shaped noise instead of nonlinear distortion [Ref 30].

As described above, the DTC ideally introduces a delay to the nth rising edge of $v_{div}$ (t) that well-approximates $T_D+\varepsilon[n]$. However, DTC gain error, which is inevitable in practice because of various types of nonideal circuit behavior, causes this delay to instead approximate $A_{DTC}(T_D+\varepsilon[n])$ where $A_{DTC}$ is a constant that deviates from its ideal value of unity. Fortunately, background calibration techniques that adaptively measure $A_{DTC}$ and compensate for it are well-known [Ref 4], [Ref 22].

FIG. 3 shows a DTC-enabled version of the PEDC of FIG. 1B in which DTC gain calibration, quantization, and DEM are applied to address the DTC's gain error, resolution limitation, and component mismatches, respectively. The details of the DEM encoder and the DTC gain calibration are well-known, established techniques that are described in detail in the cited references.

The remaining types of nonideal DTC behavior are circuit noise, and nonlinearity from sources other than component mismatches. Usually, for a given DTC topology, circuit noise can only be reduced at the expense of increased power consumption and/or area. Nevertheless, fractional-N PLLs with DTC-based QNC have been demonstrated with excellent phase noise performance and power efficiency, so the circuit noise issue has proven to be manageable [Ref 7], [Ref 8]. Unfortunately, DTC nonlinearity from sources other than component mismatches remains a significant issue, especially for DTCs with high dynamic range [Ref 6].

While careful sizing of the pMOS transistor and resistor in Inverter $I_2$ can reduce the nonlinearity of the type of DTC shown in FIG. 2 as described above, it is often not possible to reduce it sufficiently to prevent it from causing significant spurious tones. Consequently, low jitter fractional-N PLLs with DTC-based QNC typically incorporate DTC linearization techniques as mentioned above.

FIG. 4 shows that the DTC can also be implemented as a cascade of 1-bit DTC stages. The DTC of FIG. 4 is generally avoided because it introduces high mismatch error. A PLL of the invention makes the DTC of FIG. 4 practical, as described in the detailed description of the preferred embodiments. Ideally, the $i^{th}$ DTC stage introduces a delay of $\delta_i[n]=T_i+c_i[n]\Delta_i$, where $T_i$ is a constant delay, $c_i[n]$ is the i th output bit of the DEM encoder preceding the DTC, and $\Delta_i$ is a constant which represents the DTC stage's delay step-size. For example, each 1-bit DTC stage in FIG. 4 can be implemented by the DTC shown in FIG. 2 except with a single capacitor and nMOS transistor in place of the full DTC capacitor bank. To the extent that the inverters at the input and output of each stage provide sufficient isolation that the ith stage's delay, $\delta_i[n]$, does not depend on $c_j[n]$ for any $j\neq i$, each DTC stage introduces one of only two possible delays to its input at any given time so each 1-bit stage is inherently linear (two points always lie on a straight line). However, component mismatches cause the two possible delays from each DTC stage to have static deviations from their ideal values, which, in the absence of DEM, would introduce overall DTC nonlinearity. Fortunately, by scrambling the usage pattern of the DTC stages, the DEM encoder causes error from component mismatches to introduce noise-like error instead of nonlinear distortion [Ref 30].

However, unlike the single-stage DTC of FIG. 2 wherein mismatch noise is dominated mainly by unit capacitor mismatches, every component within each stage of the multi-stage DTC contributes to the DTC's mismatch noise. As mentioned above, this typically causes the mismatch noise from the multi-stage DTC of FIG. 4 to be so high that its application to QNC in low jitter PLLs has been problematic to date. Preferred digital-to-time converter (DTC) mismatch-noise cancellation circuits of the invention address this problem.

REFERENCES

[Ref 1] A. Swaminathan, A. Panigada, E. Masry and I. Galton, "A Digital Requantizer with Shaped Requantization Noise That Remains Well Behaved After Nonlinear Distortion," IEEE Transactions on Signal Processing, vol. 55, no. 11, pp. 5382-5394, November 2007.

[Ref 2] E. Familier and I. Galton, "A Fundamental Limitation of DC-Free Quantization Noise with Respect To Nonlinearity-Induced Spurious Tones," IEEE Transactions on Signal Processing, vol. 61, no. 16, pp. 4172-4180, August 2013.

[Ref 3] M. Zanuso, S. Levantino, C. Samori, and A. Lacaita. "A 3 MHz-BW 3.6 GHz digital fractional-N PLL with sub-gate-delay TDC, phase-interpolation divider, and digital mismatch cancellation," IEEE International Solid-State Circuits Conference-(ISSCC), pp. 476-477, 2010.

[Ref 4] D. Tasca, M. Zanuso, G. Marzin, S. Levantino, C. Samori and A. L. Lacaita, "A 2.9-4.0-GHz Fractional-N Digital PLL With Bang-Bang Phase Detector and 560-fsrms Integrated Jitter at 4.5-mW Power," IEEE Journal of Solid-State Circuits, vol. 46, no. 12, pp. 2745-2758, December 2011.

[Ref 5] N. Pavlovic and J. Bergervoet, "A 5.3 GHz digital-to-time-converter-based fractional-N all-digital PLL," IEEE International Solid-State Circuits Conference, pp. 54-56, December 2011.

[Ref 6] W. Wu et al., "A 14-nm Ultra-Low Jitter Fractional-N PLL Using a DTC Range Reduction Technique and a Reconfigurable Dual-Core VCO," IEEE Journal of Solid-State Circuits, vol. 56, no. 12, pp. 3756-3767, December 2021.

[Ref 7] W. Wu et al., "A 28-nm 75-fs_rms Analog Fractional-N Sampling PLL With a Highly Linear DTC Incorporating Background DTC Gain Calibration and Reference Clock Duty Cycle Correction," IEEE Journal of Solid-State Circuits, vol. 54, no. 5, pp. 1254-1265, May 2019.

[Ref 8] A. Santiccioli et al., "A 66-fs-rms Jitter 12.8-to-15.2-GHz Fractional-N Bang-Bang PLL with Digital Frequency-Error Recovery for Fast Locking," IEEE Journal of Solid-State Circuits, vol. 55, no. 12, pp. 3349-3361, December 2020.

[Ref 9] S. Levantino, G. Marucci, G. Marzin, A. Fenaroli, C. Samori and A. L. Lacaita, "A 1.7 GHz Fractional-N Frequency Synthesizer Based on a Multiplying Delay-Locked Loop," IEEE Journal of Solid-State Circuits, vol. 50, no. 11, pp. 2678-2691, November 2015.

[Ref 10] A. Tharayil Narayanan et al., "A Fractional-N Sub-Sampling PLL using a Pipelined Phase-Interpolator with an FoM of −250 dB," IEEE Journal of Solid-State Circuits, vol. 51, no. 7, pp. 1630-1640, July 2016

[Ref 11] S. Levantino, G. Marzin and C. Samori, "An Adaptive Pre-Distortion Technique to Mitigate the DTC Nonlinearity in Digital PLLs," IEEE Journal of Solid-State Circuits, vol. 49, no. 8, pp. 1762-1772, August 2014.

[Ref 12] N. Markulic et al., "A DTC-Based Subsampling PLL Capable of Self-Calibrated Fractional Synthesis and Two-Point Modulation," in IEEE Journal of Solid-State Circuits, vol. 51, no. 12, pp. 3078-3092, December 2016.

[Ref 13] B. Liu, et. al., "A Fully Synthesizable Fractional-N MDLL With Zero-Order Interpolation-Based DTC Nonlinearity Calibration and Two-Step Hybrid Phase Offset Calibration," IEEE Transactions on Circuits and Systems I: Regular Papers, vol. 68, no. 2, pp. 603-616, February 2021.

[Ref 14] R. B. Staszewski et al., "All-digital PLL and transmitter for mobile phones," IEEE Journal of Solid-State Circuits, vol. 40, no. 12, pp. 2469 2482, December 2005.

[Ref 15] R. Tonietto, E. Zuffetti, R. Castello and I. Bietti, "A 3 MHz Bandwidth Low Noise RF All Digital PLL with 12 ps Resolution Time to Digital Converter," 32nd European Solid-State Circuits Conference, 2006, pp. 150-153, September 2006.

[Ref 16] C. Weltin-Wu, E. Temporiti, D. Baldi and F. Svelto, "A 3 GHz Fractional-N All-Digital PLL with Precise Time-to-Digital Converter Calibration and Mismatch Correction," 2008 IEEE International Solid-State Circuits Conference, pp. 344-618, February 2008.

[Ref 17] C. Hsu, M. Z. Straayer and M. H. Perrott, "A Low-Noise Wide-BW 3.6-GHz Digital Δ Fractional-N Frequency Synthesizer with a Noise-Shaping Time-to-Digital Converter and Quantization Noise Cancellation," in IEEE Journal of Solid-State Circuits, vol. 43, no. 12, pp. 2776-2786, December 2008.

[Ref 18] V. Kratyuk, P. K. Hanumolu, K. Ok, U.-K. Moon, K. Mayaram, "A Digital PLL With a Stochastic Time-to-Digital Converter," IEEE Transactions on Circuits and Systems I: Regular Papers, vol. 56, no. 8, pp. 1612 1621, August 2009.

[Ref 19] E. Temporiti, C. Weltin-Wu, D. Baldi, M. Cusmai and F. Svelto, "A 3.5 GHz Wideband ADPLL With Fractional Spur Suppression Through TDC Dithering and Feedforward Compensation," IEEE Journal of Solid-State Circuits, vol. 45, no. 12, pp. 2723-2736, December 2010.

[Ref 20] C. Venerus and I. Galton, "Delta-Sigma FDC Based Fractional-N PLLs," IEEE Transactions on Circuits and Systems I: Regular Papers, vol. 60, no. 5, pp. 1274-1285, May 2013.

[Ref 21] G. Marucci, S. Levantino, P. Maffezzoni and C. Samori, "Analysis and Design of Low-Jitter Digital Bang-Bang Phase-Locked Loops," IEEE Transactions on Circuits and Systems I: Regular Papers, vol. 61, no. 1, pp. 26-36, January 2014.

[Ref 22] A. Elkholy, T. Anand, C. Woo-Seok, A. Elshazly, P. Hanumolu, "A 3.7 mW Low-Noise Wide-Bandwidth 4.5 GHz Digital Fractional-N PLL Using Time Amplifier-Based TDC," IEEE Journal of Solid-State Circuits, vol. 50, no. 4, pp. 867-881, April 2015.

[Ref 23] C. Weltin-Wu, E. Familier and I. Galton, "A Linearized Model for the Design of Fractional-N Digital PLLs Based on Dual-Mode Ring Oscillator FDCs," IEEE Transactions on Circuits and Systems I: Regular Pa-

[Ref 24] F.-W. Kuo et al., "An All-Digital PLL for Cellular Mobile Phones in 28-nm CMOS with −55 dBc Fractional and −91 dBc Reference Spurs," IEEE Transactions on Circuits and Systems I: Regular Papers, vol. 65, no. 11, pp. 3756-3768, November 2018.

[Ref 25] E. Alvarez-Fontecilla, A. I. Eissa, E. Helal, C. Weltin-Wu and I. Galton, "Delta-Sigma FDC Enhancements for FDC-Based Digital Fractional-N PLLs," IEEE Transactions on Circuits and Systems I: Regular Papers, vol. 68, no. 3, pp. 965-974, March 2021.

[Ref 26] E. Alvarez-Fontecilla, E. Helal, A. I. Eissa and I. Galton, "Spectral Breathing and Its Mitigation in Digital Fractional-N PLLs," IEEE Journal of Solid-State Circuits, vol. 56, no. 10, pp. 3191-3201, October 2021.

[Ref 27] N. Markulic, K. Raczkowski, P. Wambacq and J. Craninckx, "A 10-bit, 550-fs step Digital-to-Time Converter in 28 nm CMOS,"40th European Solid State Circuits Conference (ESSCIRC), pp. 79-82, 2014.

[Ref 28] W. Chang, P. Huang and T. Lee, "A Fractional-N Divider-Less Phase-Locked Loop with a Subsampling Phase Detector," IEEE Journal of Solid-State Circuits, vol. 49, no. 12, pp. 2964-2975, December 2014.

[Ref 29] X. Lin and G. Zhang, "A 12 bit 100 fs Resolution Multi-Stage Digital-to-Time Converter with Dynamic Element Matching," IEEE International Conference on Integrated Circuits, Technologies and Applications (ICTA), 2021, pp. 31-32, 2021.

[Ref 30] I. Galton, "Why Dynamic-Element-Matching DACs Work," IEEE Transactions on Circuits and Systems II: Express Briefs, vol. 57, no. 2, pp. 69-74, February 2010.

[Ref 31] K. L. Chan, N. Rakuljic and I. Galton, "Segmented Dynamic Element Matching for High-Resolution Digital-to-Analog Conversion," IEEE Transactions on Circuits and Systems I: Regular Papers, vol. 55, no. 11, pp. 3383 3392, December 2008.

[Ref 32] K. L. Chan, J. Zhu, and I. Galton, "Dynamic Element Matching to Prevent Nonlinear Distortion From Pulse-Shape Mismatches in High-Resolution DACs," IEEE Journal of Solid-State Circuits, vol. 43, no. 9, pp. 2067 2078, September 2008.

[Ref 33] D. Kong and I. Galton, "MSE Analysis of a Multi-Loop LMS Pseudo-Random Noise Canceler for Mixed-Signal Circuit Calibration," IEEE Transactions on Circuits and Systems I: Regular Papers, vol. 67, no. 9, pp. 3084 3098, September 2020.

[Ref 34] E. Helal, E. Alvarez-Fontecilla, A. I. Eissa and I. Galton, "A Time Amplifier Assisted Frequency-to-Digital Converter Based Digital Fractional-N PLL," IEEE Journal of Solid-State Circuits, vol. 56, no. 9, pp. 2711-2723, September 2021.

[Ref 35] S. Pamarti, J. Welz, and I. Galton, "Statistics of the Quantization Noise in 1-Bit Dithered Single-Quantizer Digital Delta-Sigma Modulators," IEEE Transactions on Circuits and Systems I: Regular Papers, vol. 54, no. 3, pp. 492-503, March 2007.

[Ref 36] M. Cassia, P. Shah, E. Bruun, "Analytical Model and Behavioral Simulation Approach for a ΣΔ Fractional-N Synthesizer Employing a Sample-Hold Element," IEEE Transactions on Circuits and Systems II: Analog and Digital Signal Processing, vol. 50, no. 11, pp. 850-859, November 2003.

[Ref 37] I. Syllaios, R. Staszewski, P. Balsara, "Time-Domain Modeling of an RF All-Digital PLL," IEEE Transactions on Circuits and Systems II: Express Briefs, vol. 55, no. 6, pp. 601-605.

[Ref 38] P. Billingsley, Probability and Measure, New York: John Wiley.

VARIABLES AND ACRONYMS USED IN DESCRIPTION $\alpha$ fractional value bounded in magnitude by 1.

$A_{DTC}$ constant defining deviation from ideal value of unity.

$B_k$ is a constant that is unknown because it depends on the DTC's component mismatch.

c[n] Input code word to DTC circuit (controls RC time/delay through DTC).

$c_i[n]$ the i th output bit of the DEM encoder preceding the DTC.

$\Delta_i$ a constant which represents the DTC stage's delay step-size.

$\delta_i[n]$ the delay of the ith stage of the DTC.

DCO digitally controlled oscillator.

DTC digital-to-time converter.

$e_{DTC}[n]$ DTC's mismatch noise.

$\varepsilon[n]$ represents the effect of the quantization error on the time of the nth rising output edge of the divider.

$f_{PLL}=(N+\alpha)f_{ref}$, instantaneous frequency.

$f_{ref}$ reference oscillator of frequency.

K a constant called the DTC-MNC loop gain.

L a constant that depends on the details of the DEM encoder.

Multi-modulus divider (MMD).

MNC Mismatch Noise Cancellation.

N positive integer.

p[n] phase difference between $v_{ref}(t)$ and $v_{div}(t)$ generated by PEDC.

PEDC phase-error-to-digital converter.

PLL phase locked loop $r_c[n]$ mismatch noise correction value determined by an adaptive noise cancellation circuit of the invention to cancel $r_e[n]$.

$r_e[n]$ the component of p[n] resulting from DTC mismatch noise.

$r_{ideal}[n]$ what p[n] would have been had the DTC not introduced mismatch noise.

RC Time Constant is Resistor Capacitor Time Constant $S_k[n]$ is pseudo-random noise sequence generated within the DEM $T_D+\varepsilon[n]$ time delay added to the nth output edge of the divider.

$T_i$ a constant delay.

$v_{div}(t)$ output signal of the divider.

$v_{DTC}$ (t) output signal of the DTC.

v[n] an integer-valued digital sequence generated within the PEDC.

$v_{PLL}$ (t) low-noise oscillatory output signal.

$Q_f$ quantizer

QNC quantization noise cancellation.

SUMMARY OF THE INVENTION

A preferred embodiment provides a fractional-N PLL that includes a reference oscillator, a multi-modulus divider-based phase-error-to-digital converter driven by the reference oscillator, a digital loop filter, and a digitally controlled oscillator. Digital-to-time to converter mismatch noise cancellation digital logic is between the phase-error-to-digital converter and the digital loop filter. Error from digital-to-time converter component mismatches is partially cancelled by the digital logic.

for first-order highpass shaped switching sequences with the bound predicted by Theorem 4 (dashed curve) averaging, i.e., for only one simulation run, the simulated trajectories of z_k [n] are very close to the trajectories of ¯(z_k)[n] predicted by Theorem 1. Other values of K yield results similar to those shown in FIG. 9 aside from convergence-rate and noise variances differences.

DETAILED DESCRIPTION OF THE PREFERRED EMBODIMENTS

A preferred embodiment is a digital-to-clock (DTC) fully digital converter that can convert a megahertz input signal to a gigahertz output signal with real-time error detection and correction to address inevitable quantization error. Convergence time (to reach a steady state) is an order of magnitude faster than existing systems, which often require on-circuit analog components for error correction that greatly increase the physical size of the chip and its power consumption. The preferred embodiment DTC is completely digital, which avoids such prior shortcomings.

Preferred DTCs of the invention employ a background calibration technique adaptively cancels error from DTC component mismatches. Adaptive cancellation is entirely digital, and is compatible with a large class of digital fractional-N PLLs, and has at least an order of magnitude lower convergence time than the above-mentioned predistortion techniques. The effective noise cancellation and convergence is supported by simulation results that quantify the convergence time and noise performance.

A preferred digital DTC mismatch noise cancellation (MNC) technique adaptively measures and cancels DTC mismatch noise in background within the PLL prior to the PLL's digital loop filter, thereby making highly-linear DTCs comprised of 1-bit DTC stages practical for low jitter digital fractional-N PLLs (although the technique is also applicable to single-stage DTCs). The DTC-MNC technique's convergence time is an order of magnitude faster than that of the fastest of the published predistortion techniques and results in significantly lower simulated jitter and spurious tones than corresponding reported simulation and measurement results for the previously published predistortion techniques. A rigorous analysis closely supported by simulation results quantifies the present DTC-MNC technique's convergence time, and proves that the DTC-MNC technique has no convergence bias and is unconditionally stable.

Preferred embodiments of the invention will now be discussed with respect to experiments and drawings. Broader aspects of the invention will be understood by artisans in view of the general knowledge in the art and the description of the experiments that follows.

Figure 5:
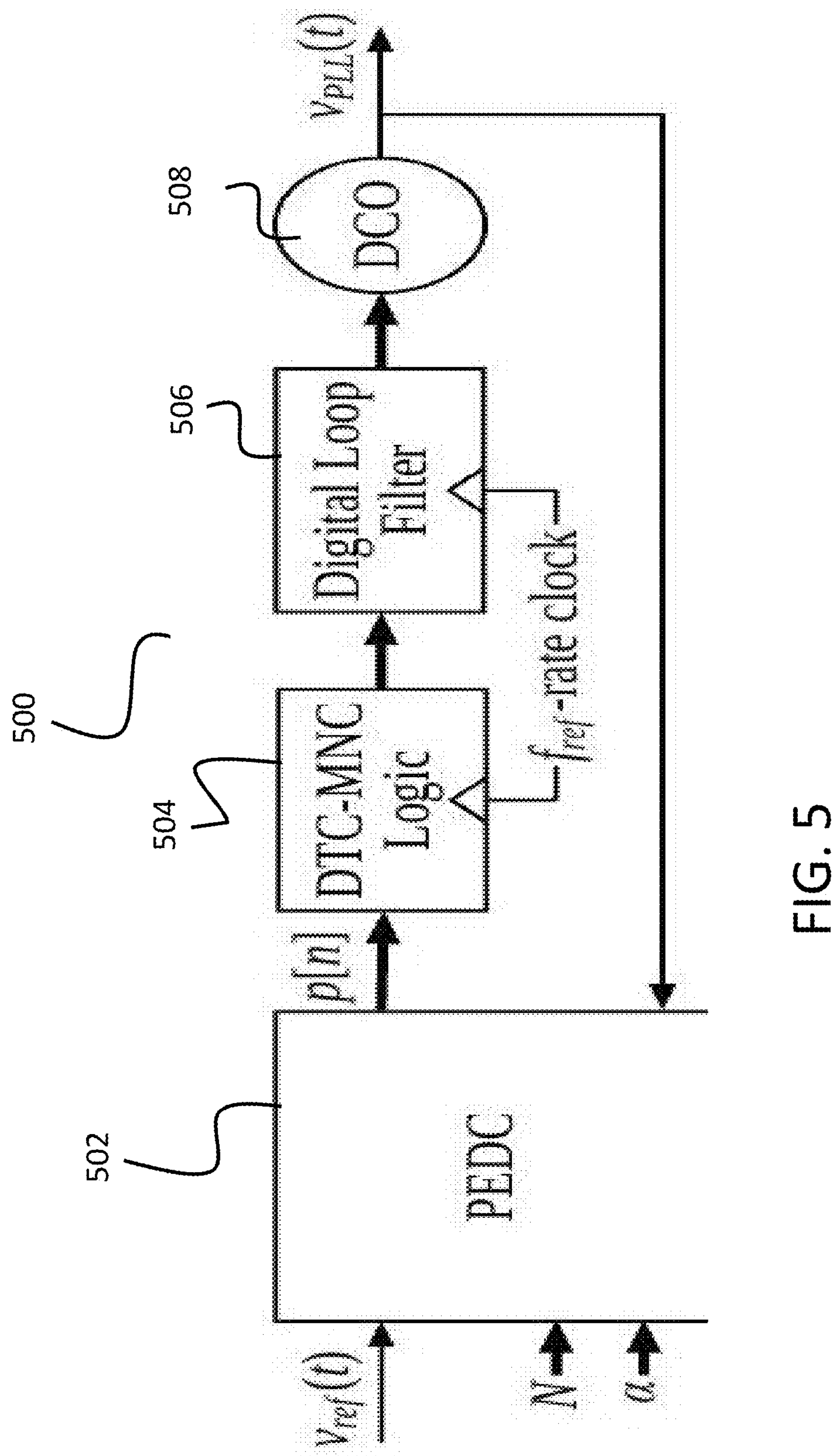
FIG. 5 is a block diagram of a preferred digital-to-time converter (DTC) mismatch-noise cancellation (MNC) circuit within a fractional N PLL.

FIG. 5 shows a preferred a preferred embodiment of a PLL (500) with a digital-to-time converter mismatch-noise cancellation (DTC-MNC) logic block 504. The PEDC 502 of FIG. 5 generates an output sequence which can be written as $$p[n] = r_{ideal}[n] + r_e[n], \tag{1}$$

where $r_{ideal}[n]$ is what p[n] would have been had the DTC not introduced mismatch noise, and $r_e[n]$ is the component of p[n] resulting from DTC mismatch noise. The purpose of the present DTC-MNC technique is to adaptively measure and cancel $r_e[n]$, which is achieved with DTC-MNC logic 504 that receives the output sequence p[n]. The DTC-MNC logic 504 is inserted into the PLL 500 that includes the PEDC 502, a low-pass digital filter 506 and a digitally controlled oscillator 508.

In general, DEM causes the DTC's mismatch noise, $e_{DTC}[n]$, to have the form $$e_{DTC}[n] = \sum_{k=1}^{L} B_k S_k[n], \quad (2)$$

where L is a constant that depends on the details of the DEM encoder, each $S_k[n]$ is a white or spectrally shaped pseudo-random sequence that is known because it is generated within the DEM encoder, and each $B_k$ is a constant that is unknown because it depends on the DTC's component mismatches [Ref 30], [Ref 32].

The PEDCs in high-performance PLLs must be quite linear to avoid inducing large spurious tones, so by far the largest term in p[n] resulting from $e_{DTC}[n]$ is a scaled and delayed version of $e_{DTC}[n]$. While PEDC nonlinearity causes p[n] to also contain a nonlinearly distorted version of $e_{DTC}[n]$ which the DTC-MNC technique does not completely cancel, the power ratio of the linear to nonlinear terms is typically several tens of dB. Provided this ratio is larger than the desired level of cancellation of $e_{DTC}[n]$, which is usually only about 30 dB, then the nonlinearity of the PEDC can be neglected. Hence, (2) implies that $r_e[n]$ can be approximated as $$r_e[n] = \sum_{k=1}^{L} b_k s_k[n], \quad (3)$$

where $b_k$ is proportional to $B_k$, $s_k[n]=S_k[n-Q]$, and Q is a positive integer delay.

Figure 6A:
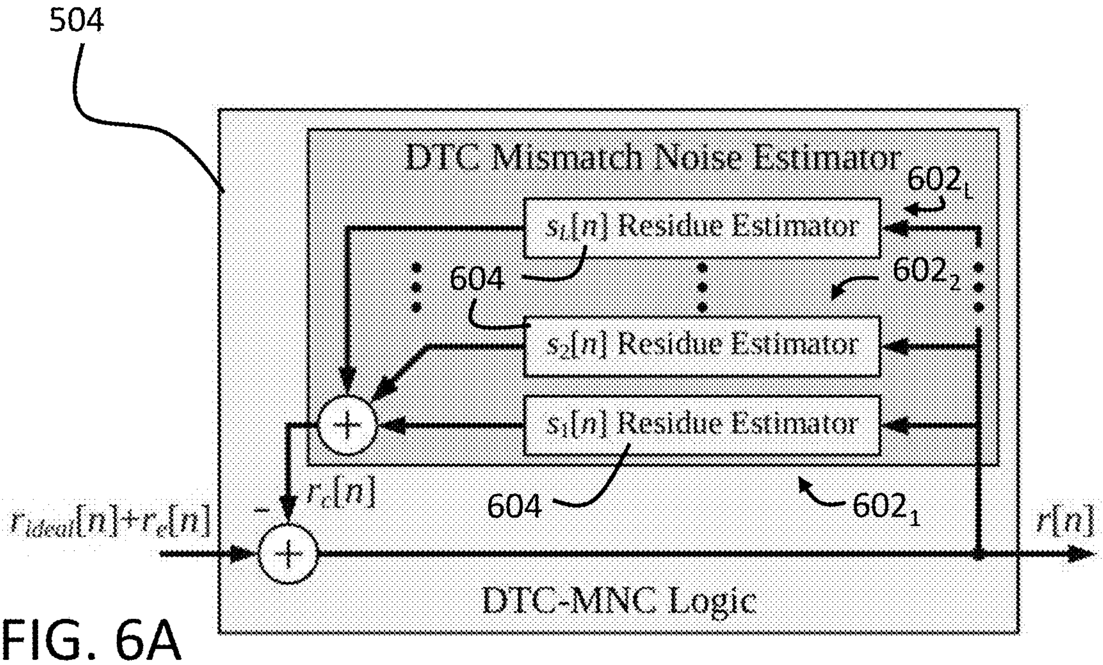
FIGS. 6A and 6B are detailed block diagrams of the DTC-MNC digital logic in the FIG. 5 circuit.
Figure 6B:
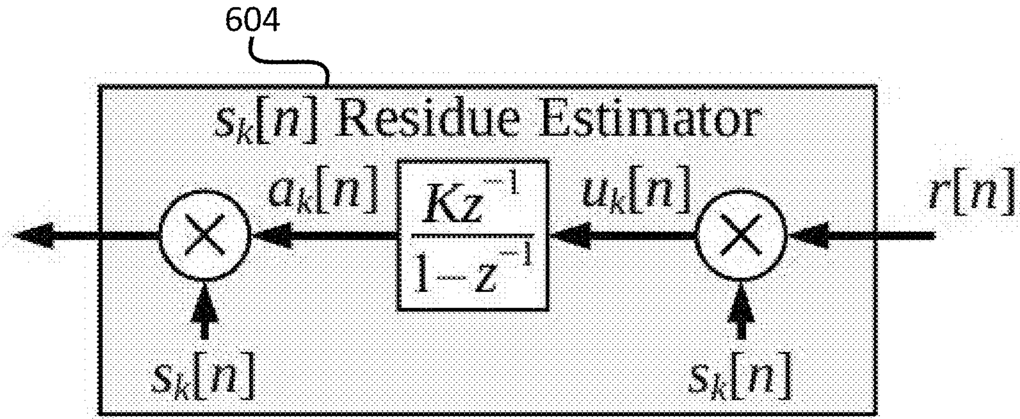

As seen in FIG. 6A, the DTC-MNC structure includes or consists of L feedback loops 602$_1$-602$_L$, each of which contains the residue estimator block 604 shown in FIG. 6B The k th residue estimator accumulates $Kr[n]s_k[n]$ and multiplies the result by $s_k[n]$, where K is a constant called the DTC-MNC loop gain. For most types of DEM including those considered in this disclosure, each $s_k[n]$ sequence is limited to values of −1,0, and 1, so the multiplications are not hardware-intensive. As proven below, the k th feedback loop estimates and cancels the k th term of (3) in background, i.e., during normal operation of the PLL.

Although the DTC-MNC technique is applicable to any type of DEM, the analysis presented in this disclosure assumes that the DEM encoder has the general form of that presented in [Ref 31], [Ref 32] and causes the DTC's mismatch noise to have either a white or first-order highpass shaped power spectral density (PSD). In all such cases, $s_k[n]$ for each k is a known, zero-mean pseudo-random sequence called a switching sequence, which takes on values of −1,0, and 1.

It is necessary in the analysis below to keep track of the values of n for which each switching sequence is non-zero, so the m th non-negative integer n for which $s_k[n]\neq 0$ is denoted as $J_{m,k}$. Therefore, $0\leq J_{1,k}<J_{2,k}<J_{3,k}< \ldots$, and $s_k[n]=0$ if $n\neq J_{m,k}$ for any value of m.

The two most common options for the switching sequences in (3) are analyzed below: white switching sequences and first-order highpass shaped switching sequences. The non-zero values of these sequences are given by $$s_k[J_{r,k}] = w_k[r], \text{ and } s_k[J_{r,k}] = (-1)^{r-1} w_k\left[\left\lfloor \frac{r-1}{2} \right\rfloor\right], \quad (4)$$

respectively, where r=1,2,3, . . . , the sequences $w_k[p]$, for all k and p, are independent zero-mean random variables, each of which is restricted to values of −1 and 1, and $\lfloor x \rfloor$ for any real number x denotes the largest integer less than or equal to x.

The two switching sequence options correspond to the switching sequences generated by mismatch scrambling and first-order highpass mismatch shaping DEM encoders, respectively. For the latter case, (4) implies that each successive pair of non-zero $s_k[n]$ values is either 1, −1, or −1, 1, where the choice between these two possibilities is made randomly with equal probability and independently from all other variables in the system.

Figure 3:
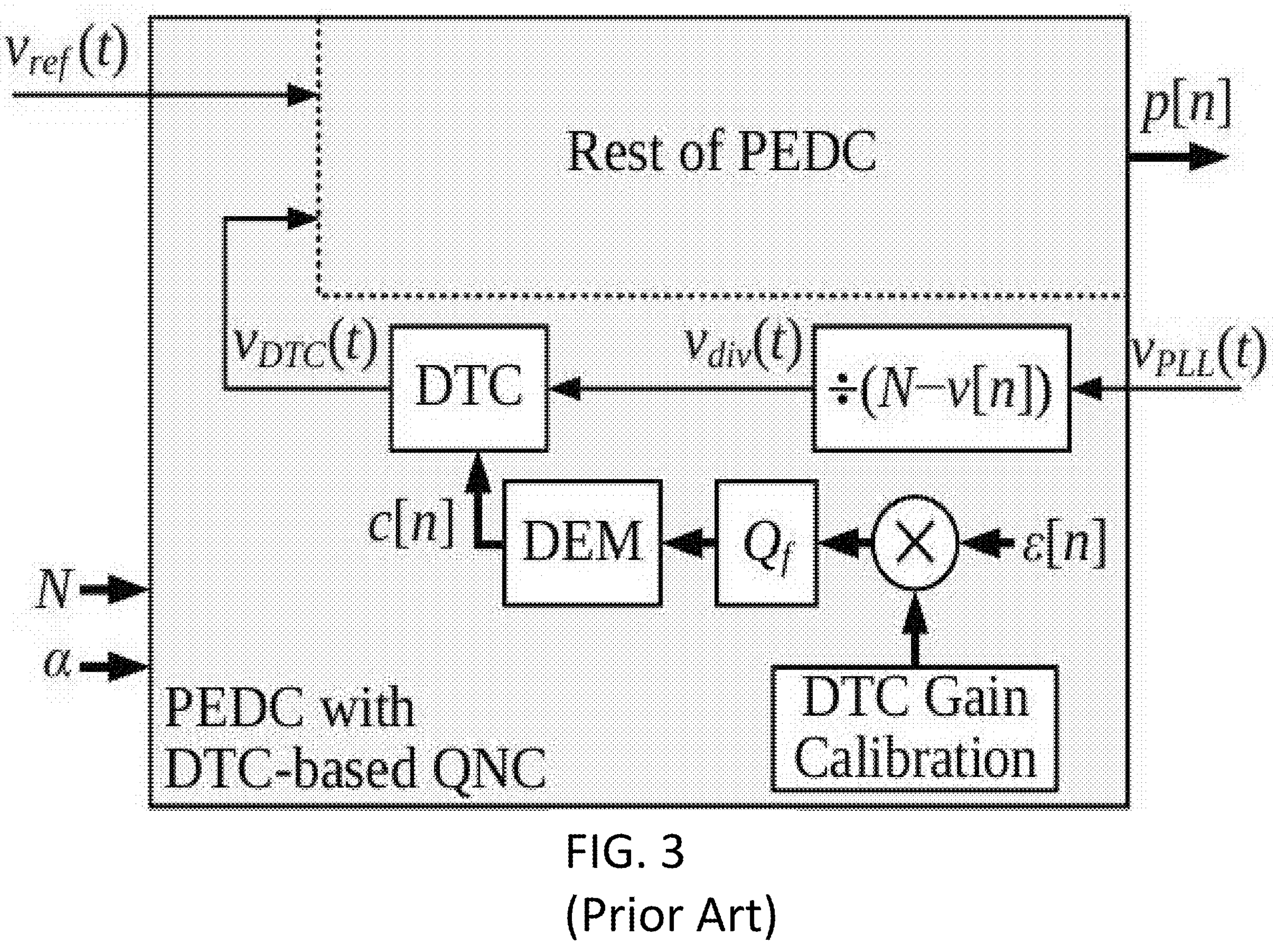
FIG. 3 (Prior Art) shows a DTC-enabled version of the PEDC of FIG. 1B in which DTC gain calibration, quantization, and DEM are applied to address the DTC's gain error, resolution limitation, and component mismatches, respectively.

The DTC-MNC logic 504 is a special case of the multi-loop least-mean-square (LMS) like noise canceler analyzed in [Ref 33] for the case of white switching sequences, but not for the case of spectrally-shaped switching sequences. Furthermore, the DTC-MNC logic for both types of switching sequences differs in two ways from the noise canceler presented in [Ref 33], and these differences enable the significantly different and much more precise analysis provided by the present noise cancellation. One difference is that the input to the DEM encoder that drives the DTC is not arbitrary; it is the sum of the quantization noise component of v[n] and quantization noise from the $Q_f$ quantizer in FIG. 3, each of which is the result of either dithered digital quantization or digital ΔΣ modulation in typical PLLs. The analysis presented in this disclosure relies on the properties of such DTC input sequences to accurately quantify the convergence speed of the DTC-MNC technique. The other difference is that the DTC-MNC logic 504 is simpler than the noise canceler presented [Ref 33], which allows for much tighter error bounds than were derived in [33].

From FIGS. 6A and 6B and (3), $$a_k[n] = a_k[n-1] + Ku_k[n-1] \quad (5)$$

for each k=1,2, . . . , L, where $$u_k[n] = s_k[n]\left(r_{ideal}[n] + \sum_{l=1}^{L} s_l[n](b_l - a_l[n])\right) \quad (6)$$

The objective of the DTC-MNC logic is to cause $r_c[n]=r_e[n]$ such that $r[n]=r_{ideal}[n]$. FIGS. 6A and 6B implies that $$r_c[n] = \sum_{k=1}^{L} s_k[n] a_k[n] \quad (7)$$

with which (3) implies that this objective would be perfectly achieved if each $a_k[n]$ coefficient were equal to $b_k$. Therefore, the convergence error of each accumulator in FIG. 6B is defined as $$z_k[n] = a_k[n] - b_k \quad (8)$$

Combining (5), (6), and (8) with n replaced by n+1 gives $$z_k[n+1] = z_k[n] + Ks_k[n]r_{ideal}[n] - Ks_k[n]\sum_{l=1}^{L} s_l[n]z_l[n] \quad (9)$$

for each k=1,2, . . . , L. Therefore, $z_k[n]$ for each k=1,2, . . . , L is specified for all n≥0 by difference equations (9) with initial conditions $$z_j[0] = a_j[0] - b_j \text{ for } j = 1, 2, \ldots, L \quad (10)$$

The system is considered to be "turned on" at time n=0, so $$z_j[n] = 0 \text{ for } n < 0 \text{ and } j = 1, 2, \ldots, L \quad (11)$$

The theorems presented below and discussed subsequently, which are proven in the appendix, apply to switching sequences given by (4) and system equations (9), (10), and (11). They quantify the convergence rate and noise performance of the DTC-MNC technique provided the switching sequences, which depend on the DEM encoder's input sequence, and $r_{ideal}[m]$ satisfy the theorem hypotheses. Simulation results that closely support the theorems' results are presented below.

Theorem 1: For white switching sequences and n≥0, if neither $s_j[m]$ nor $r_{ideal}[m]$ depend on whether $s_k[n]$ is zero or nonzero for any j, k, and n>m, then $$E\{z_k[n+1] | s_k[n]\} = \begin{cases} \bar{z}_k[n], & \text{if } s_k[n] = 0 \\ \bar{z}_k[n](1-K), & \text{if } s_k[n] \neq 0 \end{cases} \quad (12)$$

where $$\bar{z}_k[n] = E\{z_k[n]\}.$$

If, in addition, $$E\{s_k^2[n]\}$$

does not depend on n, and $\alpha_j[0]=0$ for j=1,2, . . . , L, then $$\bar{z}_k[n] = -b_k(1-c_kK)^n \quad (13)$$

where $$c_k = E\{s_k^2[m]\}$$

Theorem 2: For white switching sequences and n≥0, if $0<K<2c_{min}/(cL)$ neither $s_j[m]$ nor $r_{ideal}[m]$ depend on whether $s_k[n]$ is zero or nonzero for any j, k, and n>m, neither $$E\{s_k^2[n]\}$$

nor $E\{r_{ideal}^2[n]\}$ depend on n, and $$E\{s_k^2[n]\} \neq 0$$

for all k, then $$\limsup_{n\to\infty}\{\sigma_z^2[n]\} \leq \frac{Kc\sigma_{r_{ideal}}^2}{2c_{min} - KcL} \quad (14)$$

where $$\sigma_z^2[n] = \frac{1}{L}\sum_{k=1}^{L} \bar{z}_k^2[n] \quad (15)$$

$$\bar{z}_k^2[n] = E\{z_k^2[n]\},\ \sigma_{r_{ideal}}^2 = E\{r_{ideal}^2[n]\},$$

and $c_{min}$ and c are the minimum and average values of $c_k=E\{s_k^2[n]\}$ over k=1, 2, . . . , L, respectively.

Theorem 3: For first-order highpass shaped switching sequences and n≥0, if 0<K<1/L, $$E\{s_k^2[n]\}$$

does not depend on n, neither $s_j[m]$ nor $r_{ideal}[m]$ depend on whether $s_k[n]$ is nonzero for any j, k, and n>m, and $a_j[0]=0$ for j=1, 2, . . . , L, then $$|\bar{z}_k[n]| \leq |b_k|\left(1 - c_kK\left(\frac{1-LK}{1-K}\right)\right)^n \quad (16)$$

where $$c_k = E\{s_k^2[m]\}.$$

Theorem 4: For first-order highpass shaped switching sequences and n≥0, if 0<α<1, where $$a = 1 - 2c_{min}K \quad (17)$$

<min{1/L,1/2}, neither $s_j[m]$ nor $r_{ideal}[m]$ depend on whether $s_k[n]$ is zero or nonzero for any j, k, and n>m, and neither $$E\{s_k^2[n]\}$$

nor $E\{r_{ideal}^2[n]\}$ depend on n, and $$E\{s_k^2[n]\} \neq 0$$

for all k, then $$\limsup_{n\to\infty}\{\sigma_Z^2[n]\} < \frac{cK^2}{1-a}\left(\frac{2+3KL+3K^2L^2+K^3L^3}{1-KL}\right)\sigma_{r_{ideal}}^2 \quad (18)$$

where $$\sigma_z^2[n],\ \sigma_{r_{ideal}}^2$$

$c_k$, $c_{min}$, and c are as defined in the statement of Theorem 2, and $c_{max}$ is the maximum value of $$c_k = E\{s_k^2[n]\}$$

over k=1, 2, . . . , L.

Theorems 1 and 3 quantify the convergence rates of the DTC-MNC technique for white and first-order highpass switching sequences, respectively, in terms of the statistical means of $z_k[n]$, i.e., $\overline{z}_k[n]$, for all n≥0. Theorem 1 provides an exact expression for $\overline{z}_k$ [n] whereas Theorem 3 provides a tight upper bound on the magnitude of $\overline{z}_k[n]$. The theorems show that the convergence of the DTC-MNC technique is unbiased, which, with (8), implies that the mean values of $\alpha_k[n]$ converge exactly to their ideal values, $b_k$, for all k. The theorems also show that each convergence rate is exponential with a convergence speed that increases with DTC-MNC loop gain K.

While Theorems 1 and 3 show that the means of $z_k[n]$ converge to their ideal values, they do not by themselves guarantee that the DTC-MNC logic is unconditionally stable, as they do not rule out the possibility that the variances of $z_k[n]$ could conceivably diverge. Theorems 2 and 4 address this issue by bounding the steady state variances of $z_k[n]$ for white and first-order highpass shaped switching sequences, respectively. They state conditions which ensure that the variances of $z_k[n]$ are bounded, thereby ensuring unconditional stability. The bounds they provide are in terms of K, the variance of $r_{ideal}[n]$, and how frequently the switching sequences are non-zero over time. The theorems imply that the maximum variances of $z_k[n]$ decrease with K and with the variance of $r_{ideal}[m]$. Together with Theorems 1 and 3, they quantify the convergence speed versus accuracy tradeoff associated with the choice of DTC-MNC loop gain K.

The theorems also provide insight into the tradeoffs between white and first-order highpass shaped switching sequences. Typically, K is small, e.g., less than $2^{-7}$, so Theorems 1 and 3 imply that while the convergence rate is faster for white switching sequences than for first-order highpass shaped switching sequences, the difference is relatively small and decreases with K. However, Theorems 2 and 4 suggest that the variance of the convergence error is higher for first-order highpass shaped switching sequences than for white switching sequences. Nevertheless, first-order highpass shaped switching sequences suppress mismatch noise at low frequencies, so error from imperfect convergence introduced by DTC-MNC with these switching sequences tends to be suppressed at low frequencies. Consequently, the results suggest that white switching sequences become increasingly advantageous as the PLL's bandwidth is increased whereas the opposite is true as the PLL's bandwidth is decreased.

DTC Mismatch-Noise Cancellation Simulation Results.

Figures 1A, 1B:
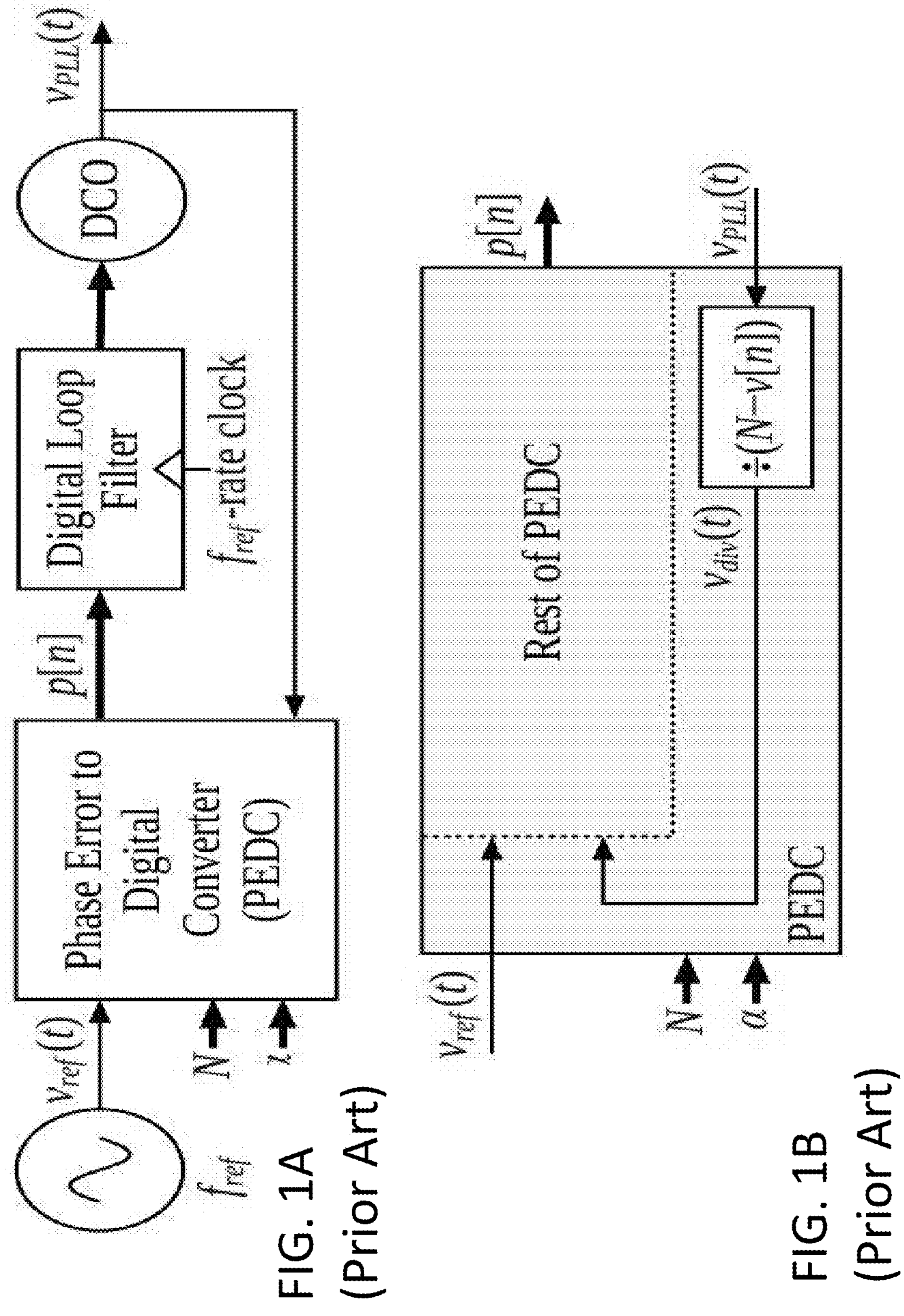
FIG. 1A (Prior Art) shows the general form of a digital fractional-N PLL driven by an $f_{ref}$-frequency reference oscillator.
FIG. 1B (Prior Art) shows the general form of a multi-modulus divider-based PEDC.
Figures 7A, 7B:
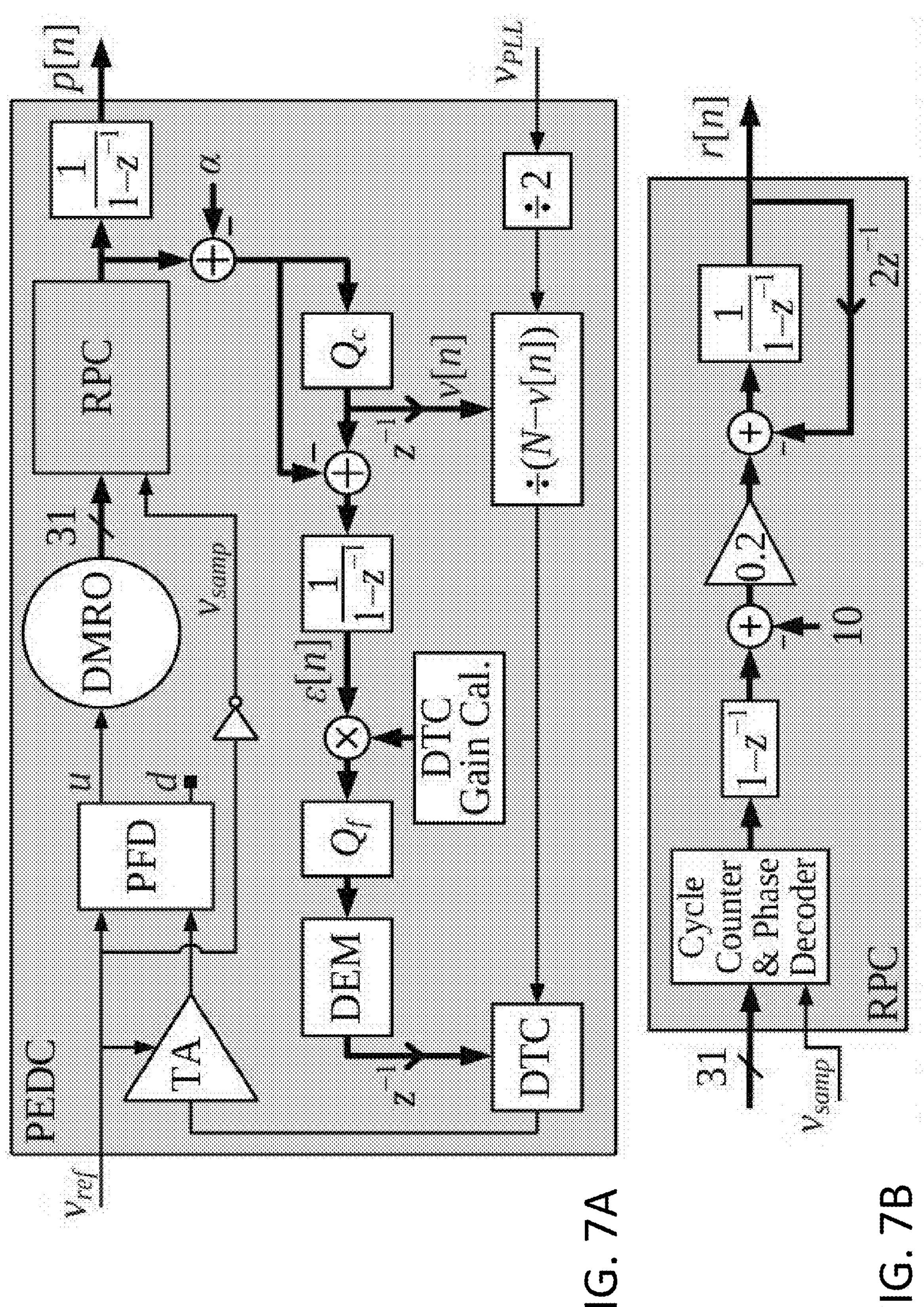
FIGS. 7A and 7B show details of a simulated PLL with a high-level view of the PEDC and digital ring phase calculator (RPC), respectively.

Simulations were conducted of a digital PLL enabled by the DTC-MNC technique, and compares them to the theoretical results presented above. The simulated PLL is based on that presented in [Ref 34] but with the modified PEDC shown in FIGS. 7A and 7B. The combination of the fixed divide-by-two and the multi-modulus divider can be viewed as a single multi-modulus divider that divides by 2(N+α), so the PEDC has the general form shown in FIG. 1*b*. The time amplifier (TA), PFD, cycle counter, phase decoder, and dividers are exactly as described in [Ref 34]. The dual-mode ring oscillator (DMRO), which has the same topology as that described in [Ref 34], has 31 delay elements and its output frequencies are approximately 3 GHz and 250 MHz when the u output of the PFD is high or low, respectively. Quantizers $Q_f$ and $Q_c$ are each implemented as 2nd-order ΔΣ modulators with LSB dither [Ref 35].

Like the original PLL presented in [Ref 34], the modified PLL has a reference frequency of $f_{ref}$=80 MHz and its output frequency is tunable from 6 GHz to 7 GHz. All the PLL simulation results described in this section correspond to $f_{PLL}$≅6.4 GHz with $\alpha f_{ref}$≅104 kHz which is about a tenth of the PLL's 1 MHz bandwidth.

Figure 4:
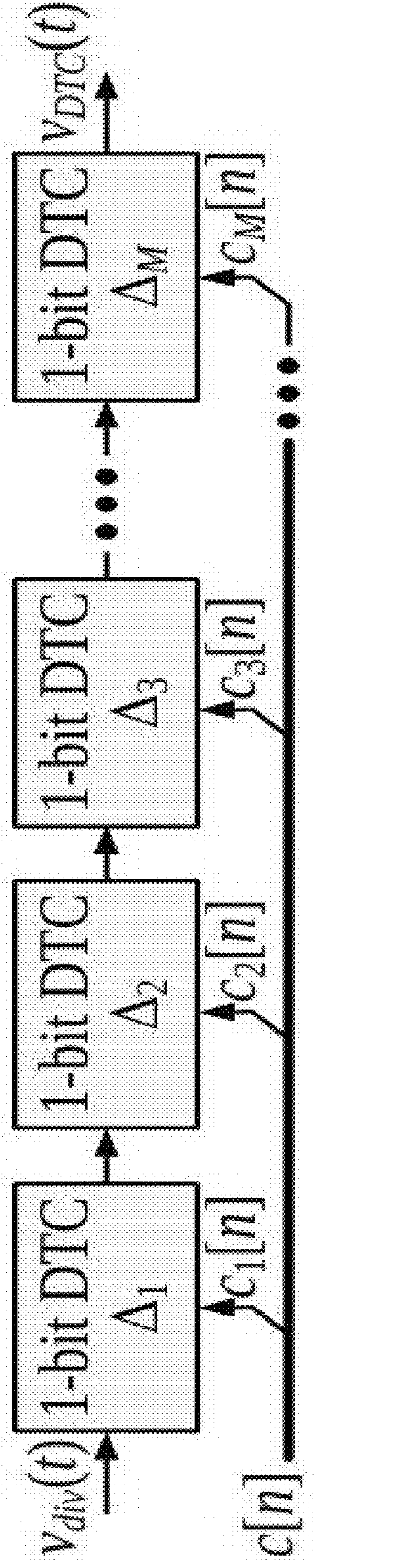
FIG. 4 (Prior Art) shows that the DTC can also be implemented as a cascade of 1-bit DTC stages.

The DTC has 9 bits of resolution and has the form shown in FIG. 4 with M=201-bit DTC stages. It is driven by a segmented DEM encoder of the type presented in [32] with the option of either white or first-order highpass mismatch shaping, and the relative 1-bit DTC stage weights were chosen based on the tradeoffs presented in [31]. The ith 1-bit DTC stage has a nominal delay step-size of $\Delta_i$=$K_i\Delta$, where Δ=1.4 ps is the DTC's minimum delay step-size, $K_1$, $K_2$, . . . , $K_{12}$ equal 1,1,2,2, 4, 4, . . . , 32, 32, respectively, and $K_{13}$=$K_{14}$= . . . =$K_{20}$=64.

The delay between the DEM encoder and p[n] is 2 reference periods, so the results presented in [Ref 32] imply that $r_e[n]$ is given by (3) with L=19 and $s_k[n]$=$S_k[n-2]$ where $S_k[n]$ is the DEM encoder's k th switching sequence. Hence, the DTC-MNC logic contains 19 residue estimators. The bus-width of each simulated residue estimator accumulator is 25 bits. The DTC gain calibration technique is as presented in [Ref 22].

Figure 2:
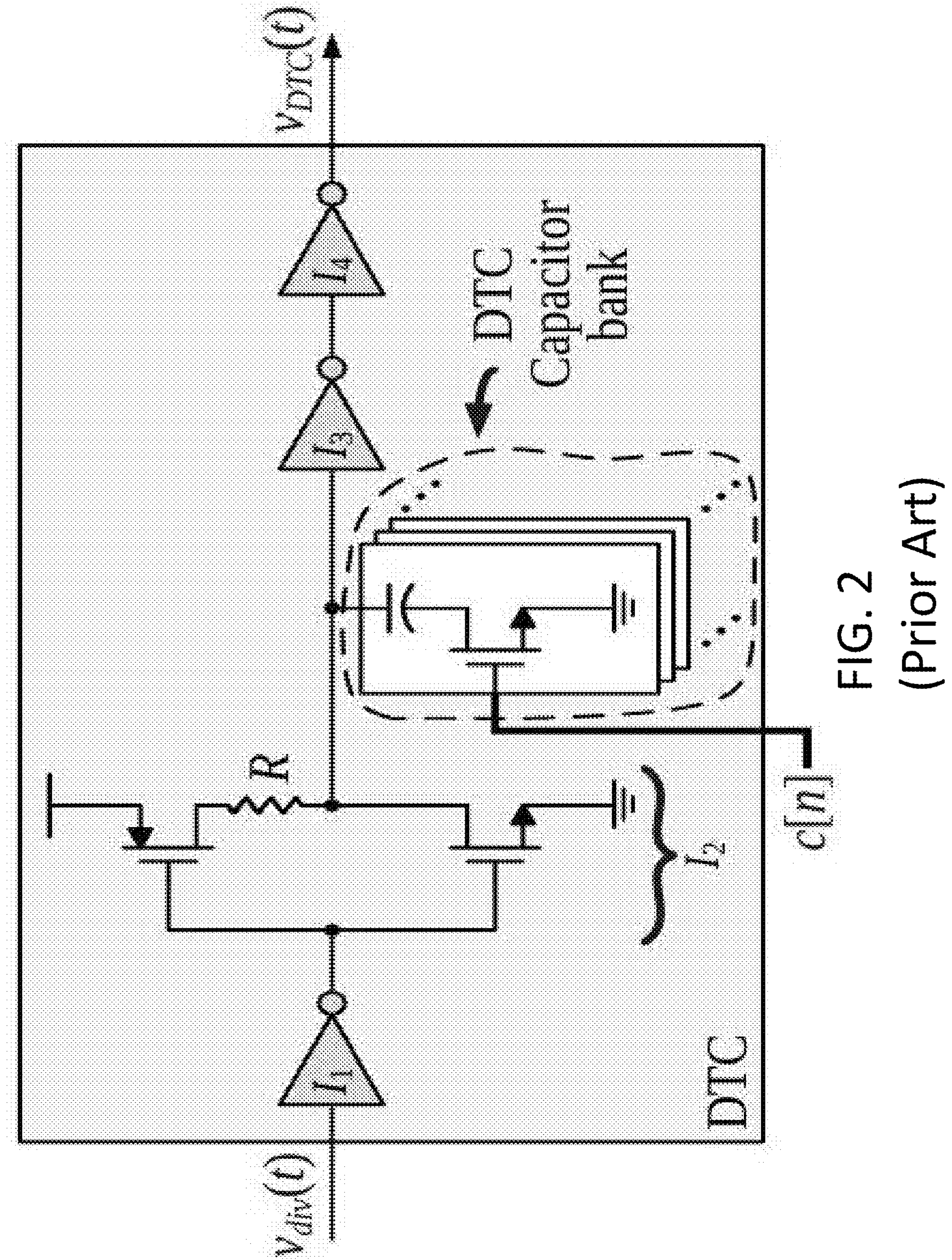
FIG. 2 (Prior Art) commonly used DTC circuit.

A transistor-level version of the DTC was designed for the Global Foundries 22FDX process, wherein each of the 20 1-bit DTC stages has the form shown in FIG. 2 except with a single capacitor and transistor in place of the DTC capacitor bank. Circuit simulations predict that the DTC's mid-code phase noise floor relative to the 80 MHz reference frequency is −161 dBc/Hz and its power consumption is 1.8 mW, which is in line with state-of-the-art designs [Ref 6], [Ref 7]. Monte-Carlo simulations predict that the DTC's unit element delay mismatch has a standard deviation of 3.1%. For the specific case corresponding to the simulation results presented below, the resulting DTC integral nonlinearity (INL) ranges between −1.6 and 1.8 DTC LSBs across the 9-bit DTC input range. Circuit simulations further predict that the PLL's worst-case fractional spur resulting from imperfect isolation among the 1-bit DTC stages is lower than −70 dBc.

The results presented in [Ref 31] ensure that the switching sequences satisfy (4), which is a requirement of the theorems presented above. By definition, $r_{ideal}[m]$ does not depend on $s_k[n]$, and it represents measured PLL phase error so it is reasonable to expect that $E\{r_{ideal}^2[n]\}$ does not depend on n once the PLL is locked. As quantified in [31], whether or not $s_k[n]$ is nonzero at time n is a complicated function of the DEM encoder's input code value at time n and some or all the values of $s_1[n]$, $s_2[n]$, . . . , $s_{k-1}[n]$ at time n. The DEM encoder's input sequence consists of quantization noise and accumulated quantization noise from the $Q_f$ and $Q_c\Delta\Sigma$ modulators, respectively, and the LSB dither causes both quantization noise sequences to be asymptotically white and uniformly distributed prior to second-order noise shaping [35]. Consequently, it is reasonable to expect that $s_k[n]$ does not depend on whether future values of $s_j[n]$ are nonzero for any j and k, and that $$E\{s_k^2[n]\}$$

is nonzero and does not depend on n. These observations, which are further supported by simulation results performed, are consistent with the hypotheses of the four theorems presented above.

Cadence Spectre PNOISE circuit simulations were used to predict the phase noise of each PLL circuit block and Monte-Carlo simulations to determine component mismatches within the DTC. The results were back-annotated into a behavioral, event-driven C-language PLL simulator (along the lines of those presented in [Ref 36]-[Ref 37]) which generated all of the simulation results presented below.

Figures 8A, 8B, 8C:
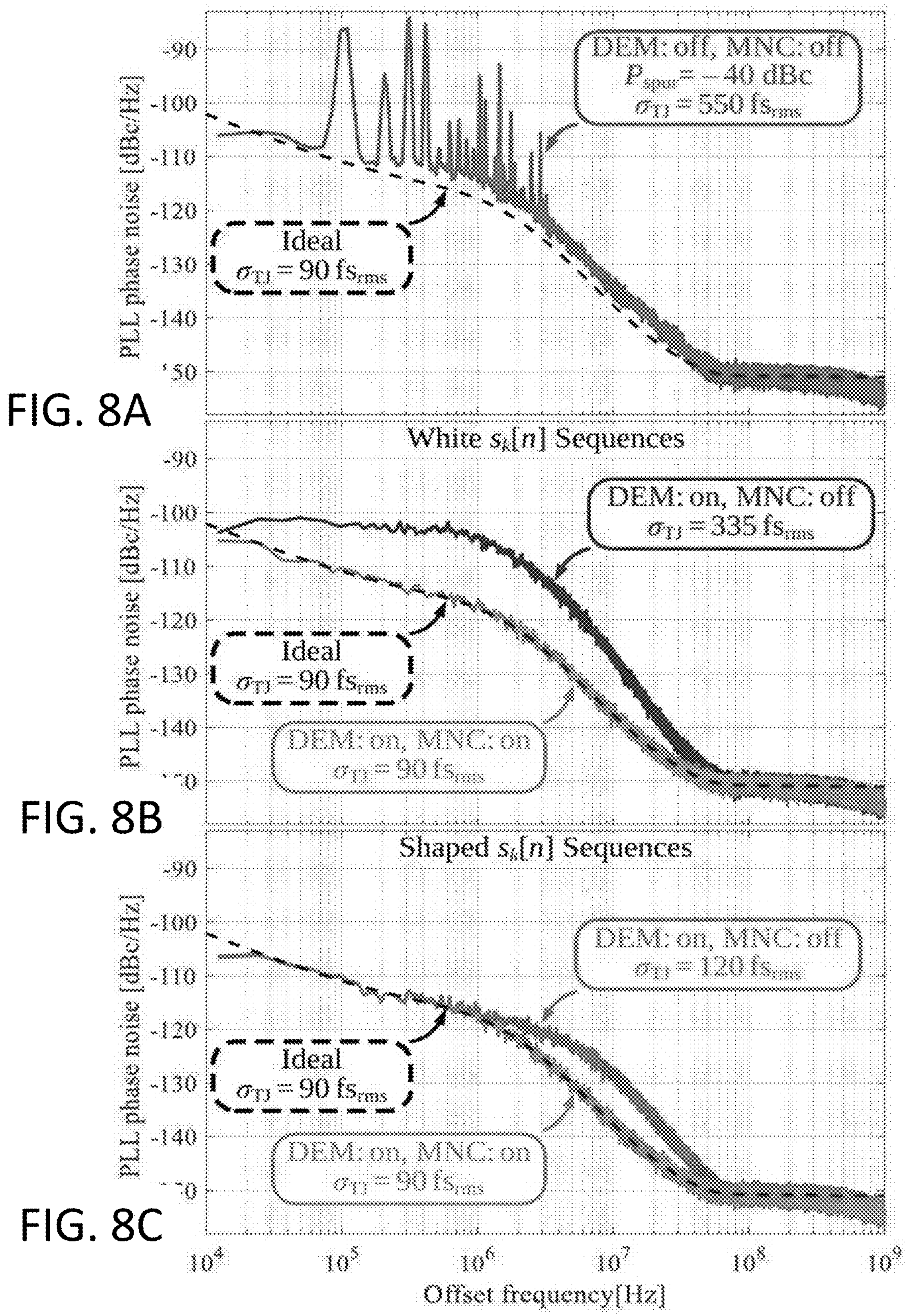
FIGS. 8A-8C shows simulated PLL phase noise spectra which demonstrate the individual and combined effects of DTC mismatches, DEM, and DTC-MNC relative to the PLL's ideal phase noise spectrum.

FIGS. 8A-8C shows simulated PLL phase noise spectra which demonstrate the individual and combined effects of DTC mismatches, DEM, and DTC-MNC relative to the PLL's ideal phase noise spectrum. Without DEM or DTC-MNC (FIG. 8A), the DTC mismatches result in large spurious tones which degrade the PLL's RMS total jitter, $\sigma_{TJ}$, (integrated from 10 kHz to 80 MHz) to 550 fs from its ideal value of 90 fs which would have occurred in the absence of DTC mismatches. Enabling DEM without DTC-MNC causes the DTC mismatches to introduce noise rather than spurious tones, but with either white (FIG. 8B) or first-order highpass shaped (FIG. 8C) switching sequences, the noise significantly degrades the PLL's jitter. In both cases, enabling DTC-MNC cancels the noise as expected such that the simulated jitter differs insignificantly from its ideal value of 90 fs.

The results shown in FIGS. 8A-8C with DTC-MNC enabled correspond to a DTC-MNC loop gain of $K=2^{-8}$. Theoretical results and simulation results presented in FIGS. 9 and 10 imply that the corresponding DTC-MNC cold-start settling time—the time from when DTC-MNC technique is first enabled with uninitialized registers to the time at which the PLL's phase noise profile becomes visually indistinguishable from that which would have occurred in the absence of DTC mismatches—is less than 2000 reference periods, i.e., less than 25μ s. This is at least an order of magnitude faster than reported for the published DTC predistortion techniques [Ref 12], [Ref 11].

Figures 9A, 9B:
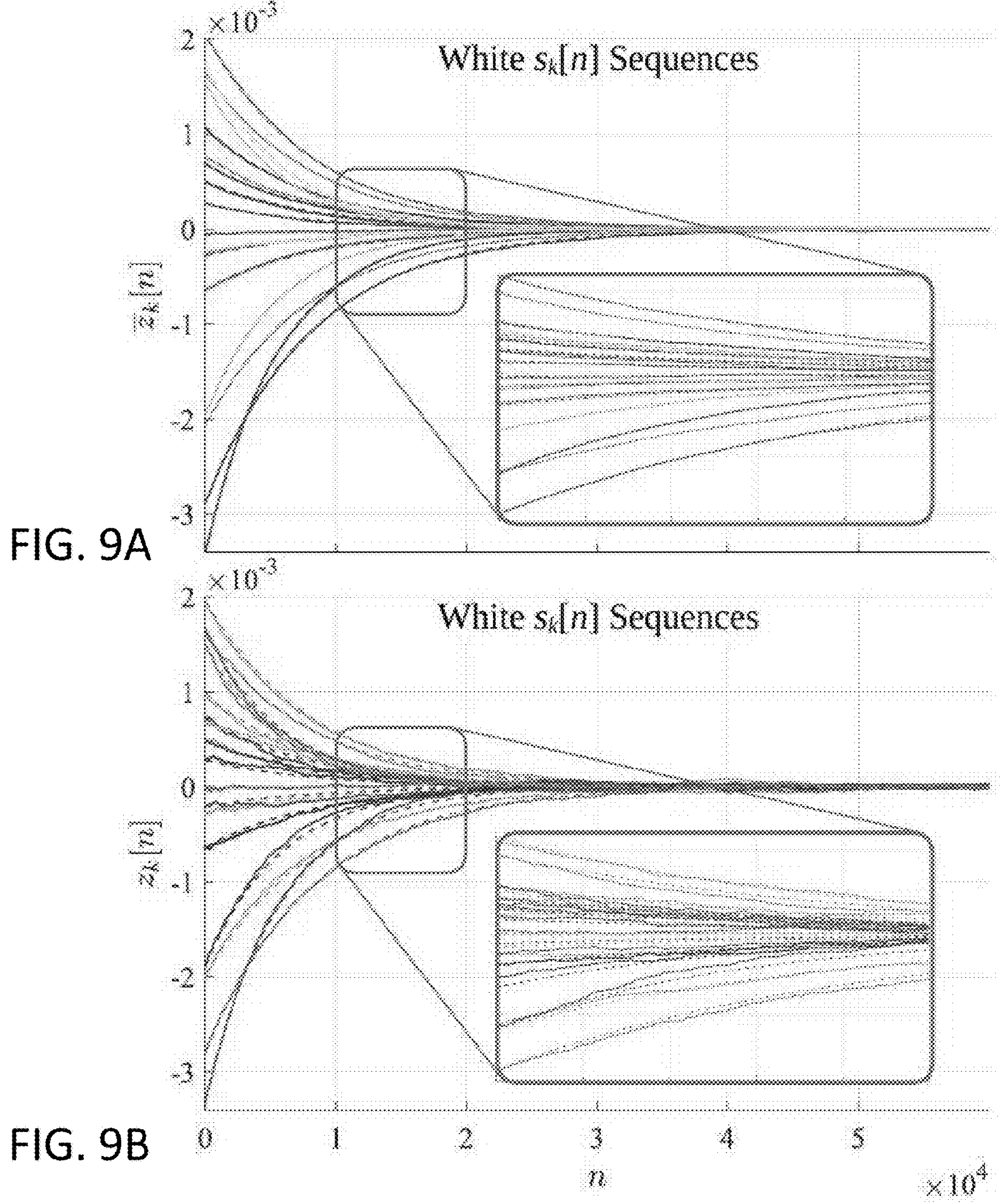
FIGS. 9A & 9B show cold start trajectories of $\overline{z}_k[n]$ for white switching sequences predicted by Theorem 1 (dashed curves) with simulated trajectories (solid curves) of a) $\overline{z}_k[n]$ and b) $z_k[n]$.

FIG. 9A shows simulated cold-start trajectories (solid curves) of the $19\bar{z}_k[\ ]$ sequences for DTC-MNC with $K=2^{-12}$ and white switching sequences along with the corresponding theoretical trajectories (dashed curves) predicted by Theorem 1. The simulated $\bar{z}_k[n]$ trajectories were obtained by averaging the $z_k[n]$ trajectories from ten separate simulation runs starting from the same initial state. As indicated in the figure, the simulated and calculated trajectories are extremely close, and the inventors have verified that the simulated and corresponding theoretical trajectories become visually indistinguishable as the number of averages is increased. In principle, the averaging option is necessary because $\bar{z}_k[n]$ in Theorem 1 is the statistical mean of $z_k[n]$. Nevertheless, as shown in FIG. 9B, even without averaging, i.e., for only one simulation run, the simulated trajectories of $z_k[n]$ are very close to the trajectories of $\bar{z}_k[n]$ predicted by Theorem 1. Other values of K yield results similar to those shown in FIG>9 aside from convergence-rate and noise variances differences.

Figure 10:
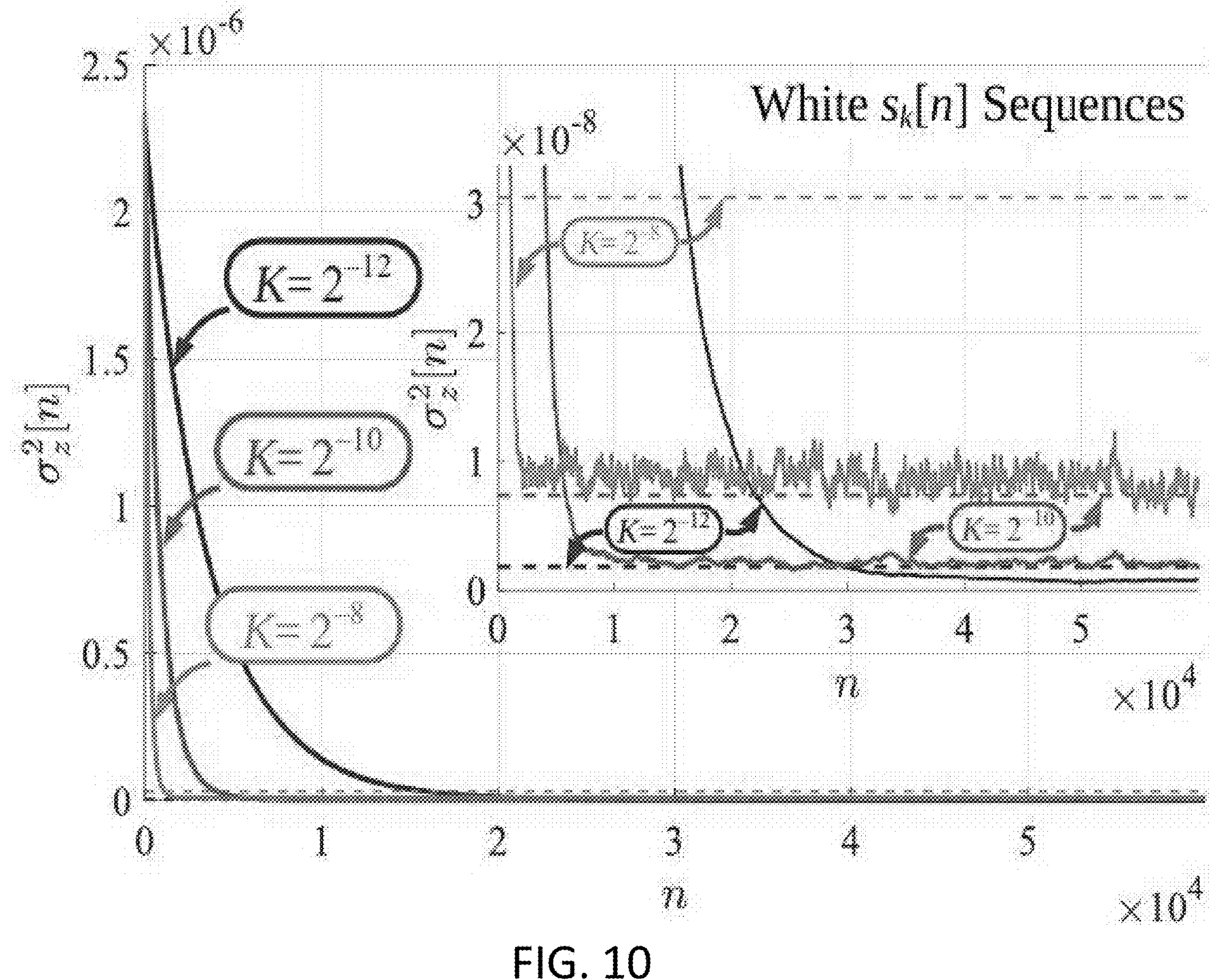
FIG. 10 shows simulated cold start trajectories (solid curves) of $\sigma_z^2[n]$ for white switching sequences with the bounds predicted by Theorem 2 (dashed curves)

FIG. 10 shows the simulated cold-start trajectories of $$\sigma_z^2[n]$$

for DTC-MNC with white switching sequences and various loop gains relative to the steady-state bounds predicted by Theorem 2. As expected, the simulated trajectories remain below the bounds predicted by Theorem 2 after the initial settling transient. As can be seen in the figure, the bounds become tighter as K is decreased.

Figure 11:
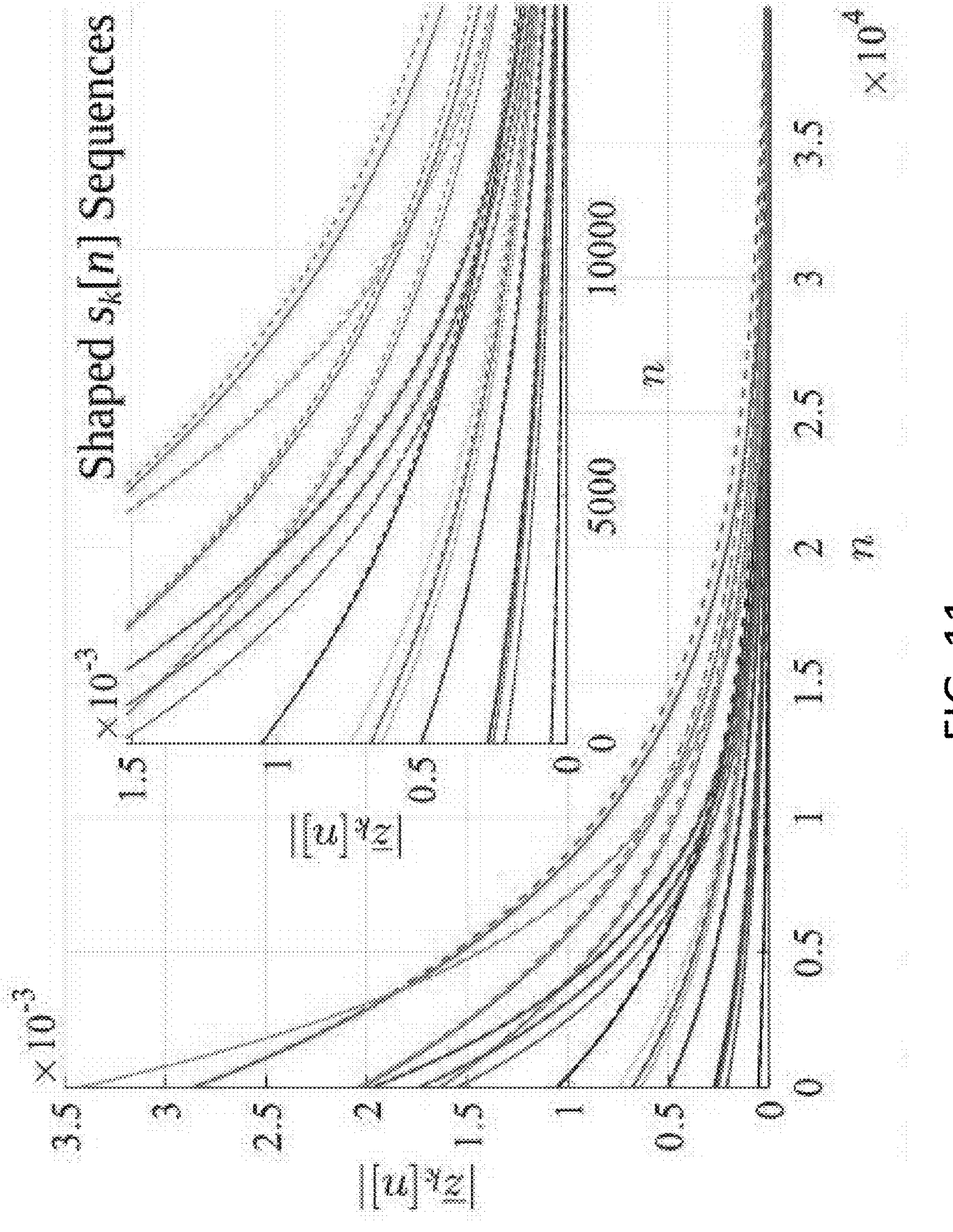
FIG. 11 shows simulated cold start trajectories (solid curves) of the magnitudes of $\overline{z}_k[n]$ for first-order highpass shaped switching sequences with the bounds predicted by Theorem 3 (dashed curves)

FIG. 11 shows results that correspond to those shown in FIG. 9A, 9B but for the case of first-order highpass shaped switching sequences. Given that Theorem 3 bounds the magnitude of $\bar{z}_k[n]$. FIG. 11 shows trajectories of the magnitudes of $\bar{z}_k[n]$, but otherwise the results including the convergence rates are very similar those shown in FIG. 11. Furthermore, as can be seen from FIG. 11, the bound provided by Theorem 3 is extremely tight.

Figure 12:
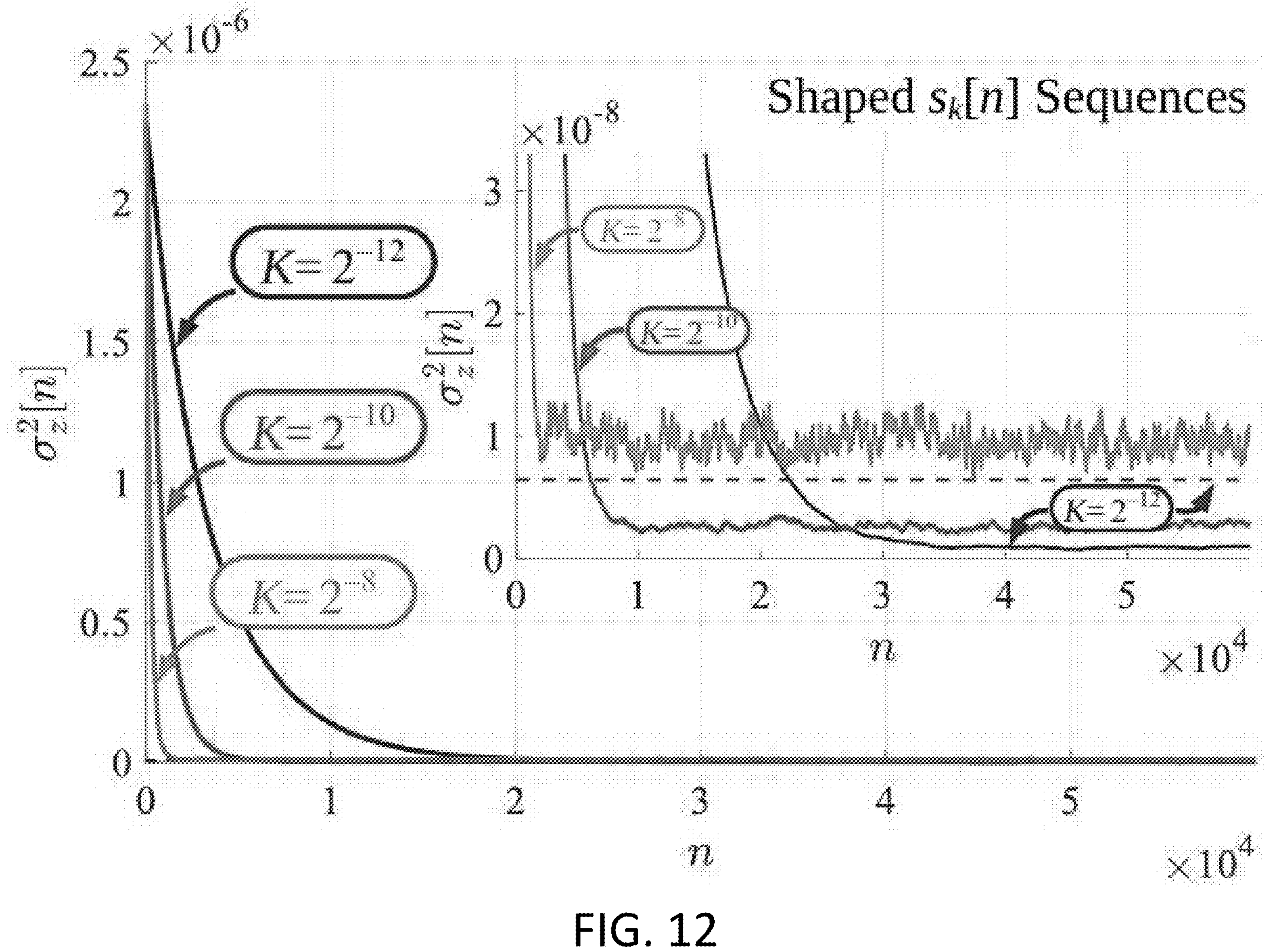
FIG. 12 shows simulated cold start trajectories (solid curves) of $$\sigma_z^2[n]$$

FIG. 12 shows results that correspond to those shown in FIG. 10, but for the case of first-order highpass shaped sequences. As with the FIG. 10 results, FIG. 12 shows results for three values of DTC-MNC loop gain, K. The hypothesis of Theorem 4 for the parameters of this particular design example restricts K to be less than or equal to about $2^{-11}$, so even though the simulation results suggest that $$\sigma_z^2[n]$$

has a steady-state bound and Theorem 3 ensures that $\bar{z}_k[n]$ converges to zero for all three cases, Theorem 4 only provides a bound for one of the three K values.

The present DTC-MNC thus provides an entirely digital background calibration technique that adaptively measures and cancels error resulting from DTC component mismatches that would otherwise degrade the phase noise of digital PLLs with DTC-based quantization noise cancellation. Aside from virtually eliminating DTC component mismatches as a source of phase noise in general, the invention indirectly addresses the well-known DTC nonlinearity problem because it facilitates the use of inherently-linear DTCs comprised of cascades of 1-bit DTC stages. Such DTCs tend to introduce excessive error from component mismatches, which has heretofore hindered their application to low jitter PLLs. Published digital predistortion techniques provide an alternate means of mitigating DTC nonlinearity, but their convergence rates are at least an order of magnitude slower than that of the the present DTC-MNC.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. A fractional-N PLL, comprising:

a reference oscillator;

a multi-modulus divider (MMD) based phase-error-to-digital converter (PEDC) driven by the reference oscillator;

a digital loop filter;

a digitally controlled oscillator; and digital-to-time to converter mismatch noise cancellation (DTC-MNC) digital logic between the PEDC and the digital loop filter; wherein error from digital-to-time converter component mismatches is partially cancelled by the DTC-MNC digital logic.

2. The PLL of claim 1, wherein:

a divide ratio of the MMD is N−v[n] where N is an integer value and v[n] is a sequence of integer values for n=0, 1, 2, . . . ;

quantization error associated with generating v[n] is partially cancelled via a digital-to-time converter (DTC) that that either follows the MMD or the reference oscillator;

the quantization error is processed by quantizing it so that its step-size matches that of the DTC and passing the result through a dynamic element matching (DEM) encoder prior to the DTC;

the DEM encoder applies pseudo-random sequences such that error caused by component mismatches within the DTC are uncorrelated with other signal components within the PLL; and the DTC-MNC digital logic makes use of digital sequences, $s_k[n]$ generated within the DEM encoder based on the pseudo-random sequences, the DEM encoder's input sequence, and the DEM encoders state, to measure and partially cancel the error in a PEDC output sequence arising from DTC component mismatches.

3. The PLL of claim 2, wherein the quantization error associated with generating v[n] is multiplied by a digital value or sequence prior to quantizing it to make its step-size matche that of the DTC, wherein the digital value or sequence compensates for non-ideal DTC gain.

4. The PLL of claim 2, wherein a quantizer prior to the DTC is implemented as a noise-shaping quantizer.

5. The PLL of claim 4, wherein the noise-shaping quantizer comprises a second-order digital delta-sigma modulator.

6. The PLL of claim 2, wherein the DTC consists of a cascade of 1-bit DTCs configured to minimize DTC non-linear distortion at the expense of increased DTC mismatch error.

7. The PLL of claim 2, wherein the DTC-MNC logic comprises a plurality of feedback loops, each of which contains a residue estimator, wherein a residue estimator in the $k^{th}$ feedback loop multiplies an output of the DTC-MNC logic by $s_k[n]$ or a delayed version of $s_k[n]$, accumulates the result scaled by a loop gain, K, and multiplies an accumulated output by $s_k[n]$ or a delayed version of $s_k[n]$, wherein accumulated outputs of the residue estimators are summed and subtracted from an input of the DTC-MNC logic.

8. The PLL of claim 2, wherein the digital sequences $s_k[n]$ are restricted to values of 1, 0, or −1 for each k and n.

9. A fractional-N PLL, comprising:

a reference oscillator;

a multi-modulus divider (MMD) based phase-error-to-digital converter (PEDC) driven by the reference oscillator;

a digital loop filter;

a digitally controlled oscillator; and digital-to-time to converter mismatch noise cancellation (DTC-MNC) means between the PEDC and the digital loop filter for partially cancelling error from digital-to-time converter component mismatches.

* * * * *